(12) United States Patent
Kwon et al.

(10) Patent No.: US 12,055,517 B2
(45) Date of Patent: Aug. 6, 2024

(54) GRAPHENE TRANSISTOR COMPRISING FUNCTIONALIZED N-HETEROCYCLIC CARBENE COMPOUND, FABRICATION METHOD THEREFOR, AND BIOSENSOR COMPRISING SAME

(71) Applicant: KOREA RESEARCH INSTITUTE OF BIOSCIENCE AND BIOTECHNOLOGY, Daejeon (KR)

(72) Inventors: Oh Seok Kwon, Daejeon (KR); Chang Soo Lee, Daejeon (KR); Seon Joo Park, Daejeon (KR); Tai Hwan Ha, Daejeon (KR); Chul Soon Park, Daejeon (KR); Kyung Ho Kim, Daejeon (KR); Jin Yeong Kim, Daejeon (KR)

(73) Assignee: KOREA RESEARCH INSTITUTE OF BIOSCIENCE AND BIOTECHNOLOGY, Daejeon (KR)

( * ) Notice: Subject to any disclaimer, the term of this patent is extended or adjusted under 35 U.S.C. 154(b) by 1045 days.

(21) Appl. No.: 16/759,432

(22) PCT Filed: Oct. 29, 2018

(86) PCT No.: PCT/KR2018/012924
§ 371 (c)(1),
(2) Date: Apr. 27, 2020

(87) PCT Pub. No.: WO2019/083342
PCT Pub. Date: May 2, 2019

(65) Prior Publication Data
US 2021/0181147 A1     Jun. 17, 2021

(30) Foreign Application Priority Data
Oct. 27, 2017 (KR) .................. 10-2017-0141049
Mar. 8, 2018 (KR) .................. 10-2018-0027512

(51) Int. Cl.
*B32B 9/00* (2006.01)
*C01B 32/186* (2017.01)
(Continued)

(52) U.S. Cl.
CPC ....... *G01N 27/4145* (2013.01); *C01B 32/186* (2017.08); *C01B 32/194* (2017.08);
(Continued)

(58) Field of Classification Search
CPC ....... Y10T 428/30; B82Y 30/00; B82Y 40/00; C01B 32/194; C01B 32/186; C01B 2204/04
(Continued)

(56) References Cited

U.S. PATENT DOCUMENTS

2007/0187694 A1* 8/2007 Pfeiffer ............... H01L 29/7781
257/E21.128
2008/0221240 A1* 9/2008 Swager .................. C07C 67/31
524/285

(Continued)

FOREIGN PATENT DOCUMENTS

KR    10-2010-0090552 A    8/2010
KR    10-2012-0114586 A    10/2012
(Continued)

OTHER PUBLICATIONS

Hye Kyung Kim et al., Reduction of the Work Function of Gold by N-Heterocyclic Carbenes, Chemistry of Materials, pp. 3403-3411, 2017.
(Continued)

*Primary Examiner* — Daniel H Miller
(74) *Attorney, Agent, or Firm* — Hauptman Ham, LLP

(57) ABSTRACT

The present invention relates to a graphene transistor comprising: a substrate; a graphene channel layer arranged on the substrate; a pair of metals spaced from each other and
(Continued)

respectively arranged at opposite ends of the graphene channel layer; and a linker layer arranged on the graphene channel layer and including an N-heterocyclic carbene compound, a fabrication method therefor, and a biosensor comprising the same. The graphene transistor according to the present invention in which the carbene group of the N-heterocyclic carbene compound forms a covalent bond with the graphene channel layer to modify the whole surface of the graphene channel layer exhibits excellent electric conductivity as a transistor and a biosensor comprising the transistor is improved in selectivity and sensitivity.

11 Claims, 24 Drawing Sheets

(51) Int. Cl.
   *C01B 32/194* (2017.01)
   *G01N 27/414* (2006.01)
   *H10K 85/20* (2023.01)
   *H10K 85/60* (2023.01)
   *B82Y 30/00* (2011.01)

(52) U.S. Cl.
   CPC ......... *G01N 27/4146* (2013.01); *H10K 85/20* (2023.02); *H10K 85/6572* (2023.02); *B82Y 30/00* (2013.01); *C01B 2204/02* (2013.01); *C01B 2204/04* (2013.01); *C01B 2204/22* (2013.01); *C01P 2002/82* (2013.01); *C01P 2002/86* (2013.01); *Y10T 428/30* (2015.01)

(58) Field of Classification Search
   USPC ........................................................ 428/408
   See application file for complete search history.

(56) References Cited

U.S. PATENT DOCUMENTS

| | | | |
|---|---|---|---|
| 2011/0017587 A1 | 1/2011 | Zhamu et al. | |
| 2011/0240980 A1* | 10/2011 | Wei | B82Y 10/00 977/734 |
| 2015/0323482 A1 | 11/2015 | Shimoyama et al. | |
| 2017/0200909 A1 | 7/2017 | Sonkusale et al. | |
| 2019/0142309 A1* | 5/2019 | Heikenfeld | A61B 5/1486 435/288.5 |

FOREIGN PATENT DOCUMENTS

| | | | |
|---|---|---|---|
| KR | 10-2013-0006869 A | 1/2013 | |
| KR | 10-2013-0027199 A | 3/2013 | |
| KR | 10-1407175 B1 | 6/2014 | |
| KR | 10-1547410 B1 | 8/2015 | |
| KR | 10-2015-0120003 A | 10/2015 | |
| KR | 10-1585767 B1 | 1/2016 | |
| KR | 10-2017-0019626 A | 2/2017 | |
| WO | 03-037791 A | 5/2003 | |
| WO | 2013/113117 A1 | 8/2013 | |

OTHER PUBLICATIONS

Extended European Search Report dated Nov. 13, 2020 in connection with the counterpart European Patent Application No. EP18871738.3.

International Search Report issued on Mar. 7, 2019 for corresponding international application No. PCT/KR2018/012924.

Toby Sainsbury et al., "Covalent Carbene-Functionalization of Graphene: Towards Chemical Band Gap Manipulation," ACS Applied Materials & Interfaces, Jan. 29, 2016, Downloaded from http://pubs.acs.org on Feb. 2, 2016.

Frank schwierz, "Graphene transistors," Nature Nanotechnology, Jul. 2010, pp. 487-496, vol. 5, www.nature.com/naturenanotechnology.

Natalia Levina et al., "Protection of *Escherichia coli* cells against extreme turgor by activation of MscS and MscL mechanosensitive channels: identification of genes required for MscS activity," The EMBO Journal , 1999, vol. 18, No. 7 pp. 1730-1737.

H. Sarvari et al., "Frequency analysis of graphene nanoribbon FET by Non-Equilibrium Green's Function in mode space," Elsevier Physica E 43, 2011, pp. 1509-1513, www.elsevier.com/locate/physe.

Office Action issued on May 18, 2024 for corresponding Chinese Patent Application No. 201880069999.1, along with partial English machine translation (12 pages).

* cited by examiner

GRAPHENE TRANSISTOR COMPRISING FUNCTIONALIZED N-HETEROCYCLIC CARBENE COMPOUND, FABRICATION METHOD THEREFOR, AND BIOSENSOR COMPRISING SAME

CROSS-REFERENCE TO RELATED APPLICATION

The present application is a national stage filing under 35 U.S.C § 371 of PCT application number PCT/KR2018/012924 filed on Oct. 29, 2018 which is based upon and claims the benefit of priorities to Korean Patent Application No. 10-2017-0141049, filed on Oct. 27, 2017 and Korean Patent Application No. 10-2018-0027512, filed on Mar. 8, 2018, in the Korean Intellectual Property Office, which are incorporated herein in their entireties by reference.

TECHNICAL FIELD

The present invention relates to a graphene transistor including a linker layer including an N-heterocyclic carbene compound having a functionalized terminal region, a fabrication method therefor, and a biosensor using the same.

BACKGROUND ART

Graphene is one of carbon allotropes that include carbon atoms, and has a two-dimensional (2D) planar layered structure with $sp^2$ hybrids of carbon atoms.

This graphene has a large surface area, is chemically stable, and shows excellent mechanical stability and thermal conductivity (approximately 5,000 W/mK), compared to the existing carbon materials. Also, the graphene has excellent transparency because its transmittance of light with a wavelength of 550 nm reaches 97% due to the low absorption of visible rays, and the like, and has superior flexibility because its electrical-electronic properties are maintained intact due to very strong elasticity even when it is physically elongated by 20%.

Also, it is known that the graphene has very high electrical conductivity (an intrinsic electron mobility of 20,000 $cm^2/Vs$) because it has a semi-metallic property in an electrical aspect and also charges in the graphene act as zero effective mass particles.

Owing to these outstanding optical, physical and chemical characteristics, graphene has emerged as one of the most promising materials since graphene was discovered by Novoselov and Game in 2004. In recent years, the applicability of graphene to touch panels, organic light emitting devices, supercapacitors, hydrogen generation/storage devices, photovoltaic batteries, photocatalysts, biosensors, and the like has been discussed.

In particular, since graphite was reported to have field-effect characteristics when graphite is mechanically peeled off so that the two-dimensional graphene of carbon atoms having a hexagonal structure is used in a transistor, graphene has come into the spotlight that can replace a conventional semiconductor material such as silicon.

For example, when graphene is fabricated into the form of nanoribbons having a channel width of 10 nm or less, a band gap is formed due to the size effect. Therefore, graphene may be used to fabricate a graphene transistor showing excellent operational characteristics even at room temperature.

Such a graphene transistor has a characteristic of linearly increasing conductivity according to the voltage of a gate. In particular, the graphene transistor has an excellent advantage in that it shows very high charge mobility because the effective mass of electrons is 0 due to the ballistic electron transfer.

In spite of the excellent physical properties as described above, however, the applicable techniques are actually very limited due to degraded uniformity and dispersibility by Van der Waals forces acting between graphene layers, or low structural stability.

In recent years, various methods have been attempted to solve the above problems. In particular, research for modification of a surface of graphene using a functional group has been actively conducted.

In particular, there is a need for modification of a surface of graphene because the modified surface of graphene has an influence on the stability of a transistor against ions in a solution or the selectivity and sensitivity of a biosensor including the transistor.

For this purpose, a covalent functionalization method of covalently binding an organic substance to a hydrophilic functional group, such as forming oxygen functional groups such as an epoxy group, a hydroxyl group, a carbonyl group, a carboxylic acid group, or the like on a surface and an end portion of graphene; a non-covalent functionalization method using a non-covalent bond such as a pi-pi bond, a hydrogen bond, or a charge-to-charge interaction; and the like were used in the related art.

For example, graphene to which certain functionality is imparted was fabricated by chemically modifying a surface of graphene by covalently binding the graphene to a functional monomer or polymer, or by physically modifying a surface of graphene with a non-covalent bond, followed by reduction with a reducing agent such as hydrazine ($N_2H_2$) or sodium borohydride ($NaBH_4$).

However, when a functional group forms a covalent bond on the surface of graphene, a $sp^2$ bond is converted into a spa bond, resulting in degraded electrical conductivity of graphene.

Also, the surface of graphene is partially modified because such a covalent bond is generally formed on a surface or an end portion of most graphene. Therefore, the partially modified graphene has certain limitations in improving the performance of transistors, and the like. In particular, it has limitations on an attachment amount of a bioprobe, which makes it impossible to express selectivity and sensitivity of a biosensor including such a graphene transistor to desired extents.

Meanwhile, the non-covalent bond has an advantage in that a method of forming a non-covalent bond is relatively simple and defects occurring on a surface of graphene may be minimized to secure excellent physical properties of graphene, but has a problem in that it shows poor stability when subjected to physical or chemical treatment.

Furthermore, because the conventional surface modification method as described above includes a multi-step process, which includes modifying a surface of graphene and reducing the graphene, the method requires an additional chemical reaction step such as use or removal of a reducing agent. This acts as one factor for degrading the performance of a graphene transistor. In addition, the conventional surface modification method has many technical defects such as low reproducibility, high-temperature processing, incompatibility with mass production, and the like.

In addition, a biosensor using a conventional graphene transistor has a problem in that it is fabricated by a two-step process, which includes subjecting graphene to a doping process and coupling a bioprobe to the graphene, to improve performance of the biosensor, which results in increased fabrication costs.

Therefore, there is a very high demand for technology capable of exhibiting the intrinsic outstanding electrical conductivity of graphene and improving selectivity and sensitivity of a biosensor including graphene, and simultaneously performing the following steps: rapidly modifying and doping a surface of graphene and binding a bioprobe to the graphene without any additional chemical reaction step.

PRIOR-ART DOCUMENT

Patent Document 1: Korean Patent Laid-Open Publication No. 2015-0120003 (Oct. 27, 2015)
Patent Document 2: Korean Patent Laid-Open Publication No. 2013-0027199 (Mar. 15, 2013)

DISCLOSURE

Technical Problem

Therefore, it is an object of the present invention to provide a transistor capable of facilitating modification of a surface of a graphene channel layer and attachment of a bioprobe to the graphene channel layer without any additional chemical reaction step, and capable of more sensitively changing electrical conductivity of the graphene channel layer via specific binding of a material to be detected, which is bound to the bioprobe.

Technical Solution

To solve the above problems, according to an aspect of the present invention, there is provided a graphene transistor, which includes a substrate, a graphene channel layer arranged on the substrate, a pair of metals arranged on the graphene channel layer to be spaced from each other, and a linker layer arranged on the graphene channel layer and including an N-heterocyclic carbene compound.

According to another aspect of the present invention, there is provided a fabrication method for a graphene transistor, which includes growing graphene on a substrate using a hydrocarbon gas as carbon source by means of a chemical vapor deposition method to form a graphene channel layer, forming a pair of metals on the graphene channel layer, and forming a linker layer on a surface of the graphene channel layer, which is exposed to the outside, using a surface treatment agent including an N-heterocyclic carbene compound.

According to still another aspect of the present invention, there is provided a biosensor including the graphene transistor as described above.

Advantageous Effects

A graphene transistor of the present invention can use an N-heterocyclic carbene compound as a linker layer to easily connect a probe unit to a graphene channel layer, and also has excellent stability to an external environmental change due to the presence of a chemical bond of the graphene channel layer to the probe unit. Therefore, the graphene transistor of the present invention has an advantage in that it can sensitively detect an electrochemical change according to a bond between a probe unit and a target material as a change in electrical conductivity of the graphene channel layer.

Also, according to a fabrication method for a graphene transistor according to the present invention, the graphene channel layer and the linker layer can be bound to graphene while a surface of the graphene is quickly and simply modified without any additional chemical reaction step, thereby enhancing convenience of fabrication and saving fabrication costs.

DESCRIPTION OF DRAWINGS

The following drawings accompanying this specification are provided to illustrate preferred embodiments of the present invention and serve to assist further understanding of the technical scope of the present invention with the aforementioned contents of the present invention. Therefore, it should be understood that the present invention should not be construed as being limited to only the details described in these drawings.

BEST MODE

Hereinafter, the present invention will be described in detail.

1. Graphene Transistor

One aspect of the present invention provides a graphene transistor.

Figure 1:
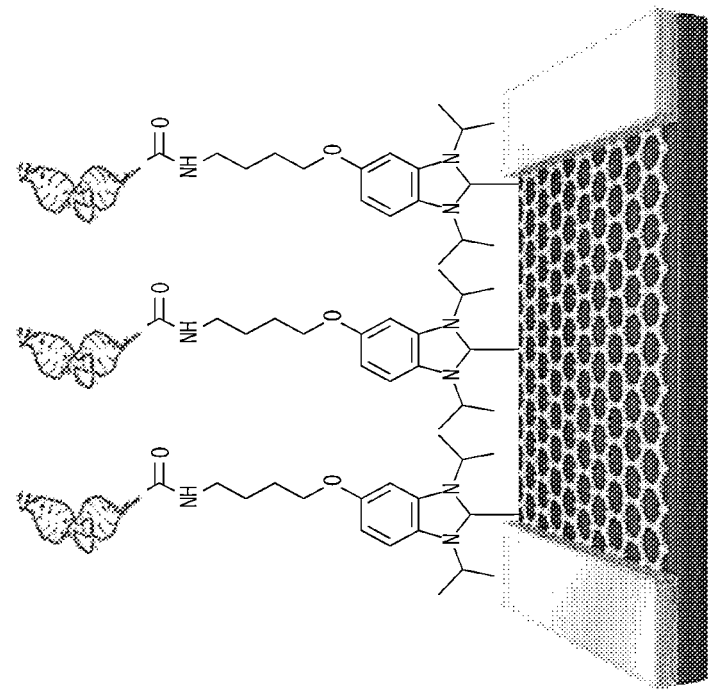
FIG. 1 is a diagram showing a graphene transistor in which a bioprobe unit is attached to a linker layer.
Figure 1:
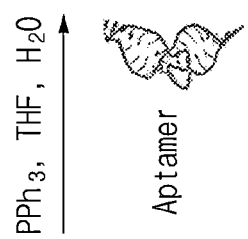
Figure 1:
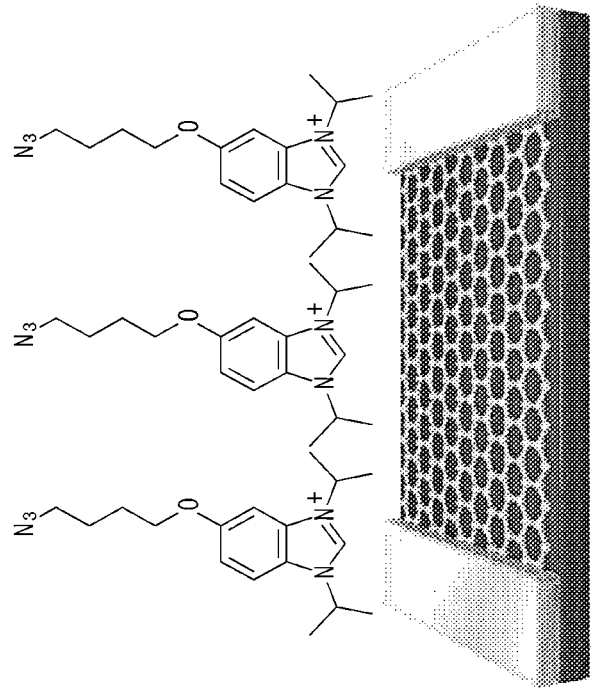

Referring to FIG. 1, the graphene transistor of the present invention includes a substrate, a graphene channel layer, a pair of metals, and a linker layer.

The substrate is configured to serve as a support configured to support constituents of the graphene transistor according to the present invention. In this case, insulating inorganic substrates such as a Si substrate, a glass substrate, a GaN substrate, a silica substrate, and the like, metal substrates such as Ni, Cu, W, and the like, plastic substrates, or the like may be used as the substrate. When the insulating substrate is used, a $SiO_2$ substrate is preferably used because the $SiO_2$ substrate has excellent affinity for the graphene channel layer.

Also, the substrate may be selected from among various materials capable of having graphene deposited thereon. For example, the substrate may be formed of a material such as silicon germanium, silicon carbide (SiC), and the like, and may include an epitaxial layer, a silicon-on-insulator layer, a semiconductor-on-insulator layer, and the like.

The graphene channel layer constituting the graphene transistor of the present invention may include graphene. In this case, an on/off ratio of an operating current may be very low because a high current flows even in an off state in which a voltage is not applied to a gate, which makes it possible to fabricate a high-performance transistor.

Figure 2:
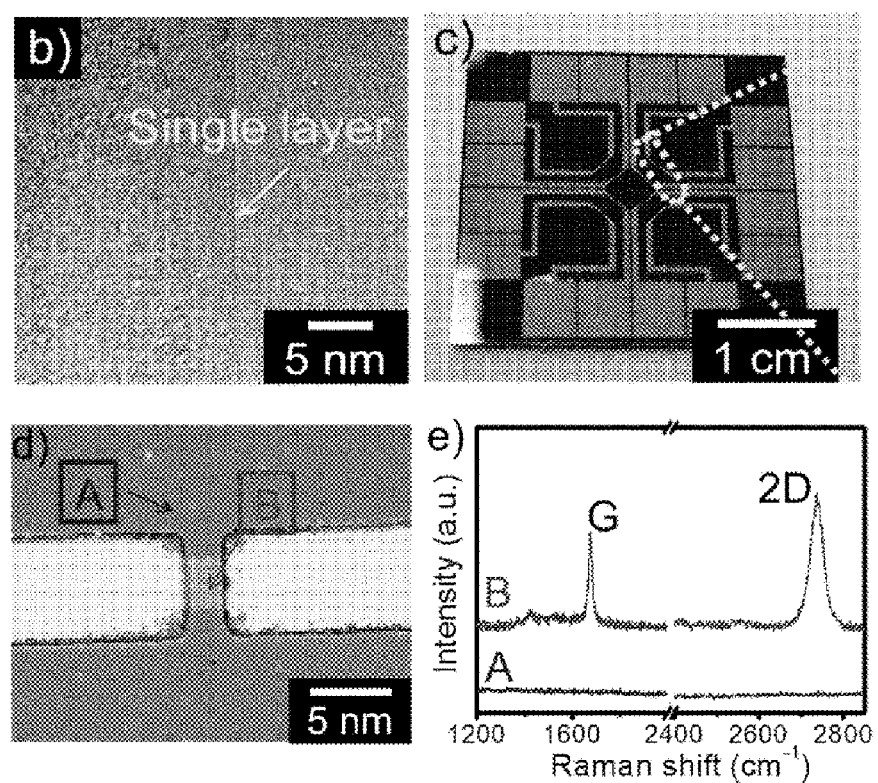
FIG. 2 is b) a TEM image of graphene formed as a single layer of a micropatterned graphene electrode fabricated in FIG. 3, c) an image of the micropatterned graphene electrode, d) a microscope image of the micropatterned graphene electrode, and e) a graph illustrating the results of Raman analysis in regions A and B of d).

The graphene channel layer may include monolayer or bilayer graphene. However, when the bilayer graphene is used, sensitivity of the biosensor may be degraded due to a drop in surface resistance. Therefore, the graphene channel layer more preferably includes monolayer graphene, as shown in FIG. 2.

The pair of metals may be a source electrode and a drain electrode that are formed on the graphene channel layer to be spaced from each other in order to apply a voltage to the graphene channel layer.

Such source and drain electrodes may be electrically connected through the graphene channel layer, and may include a material having conductivity. For example, the source and drain electrodes may be formed of a metal, a metal alloy, a conductive metal oxide, a conductive metal nitride, or the like.

For example, the source electrode and the drain electrode may each independently include one selected from the group consisting of Cu, Co, Bi, Be, Ag, Al, Au, Hf, Cr, In, Mn, Mo, Mg, Ni, Nb, Pb, Pd, Pt, Re, Rh, Sb, Ta, Te, Ti, W, V, Zr, Zn, and a combination thereof, but the present invention is not limited thereto. In this case, Pt is preferred in terms of contact characteristics of graphene and ease of etching.

Figure 3:
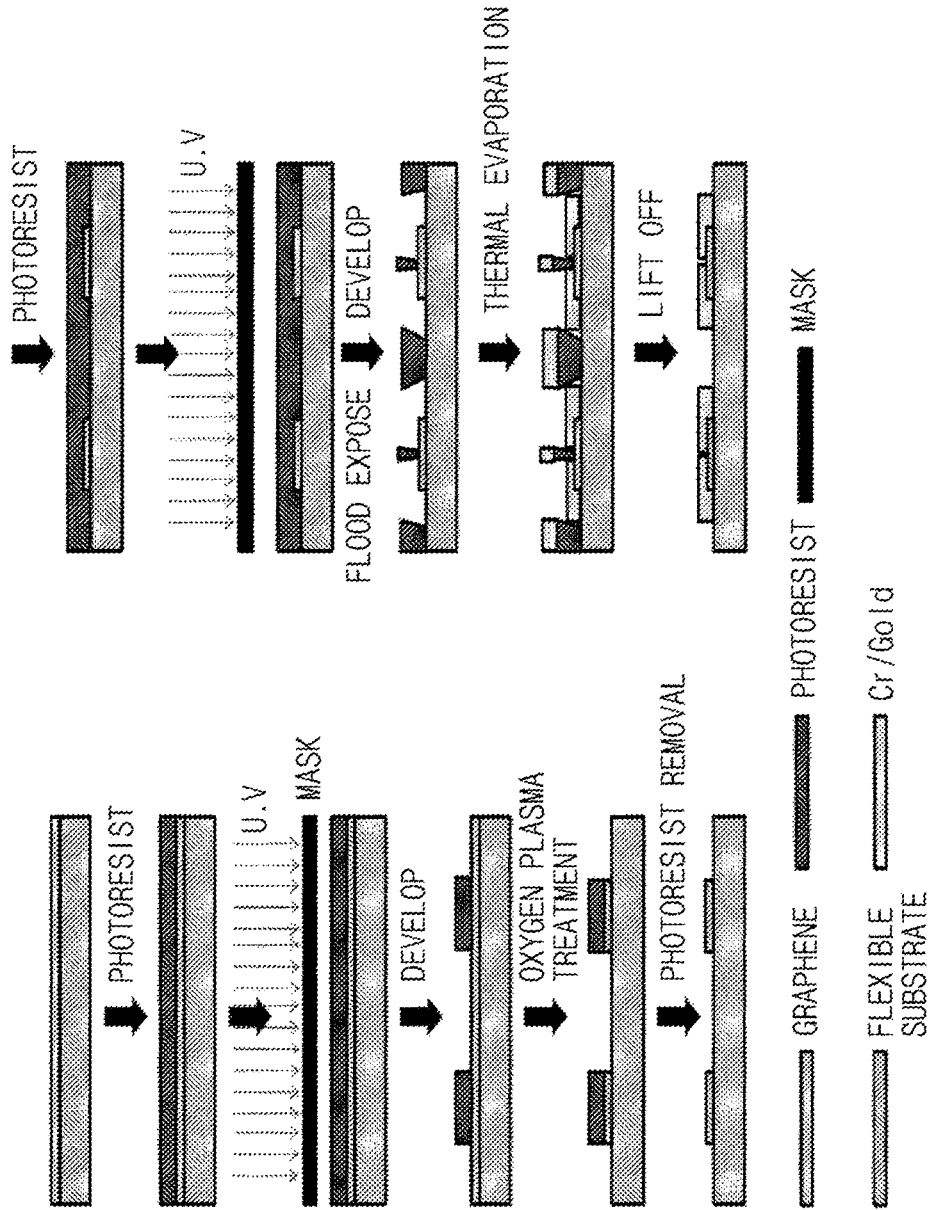
FIGS. 3 and 4 are flow charts illustrating a process of fabricating a micropatterned graphene electrode.
Figure 4:
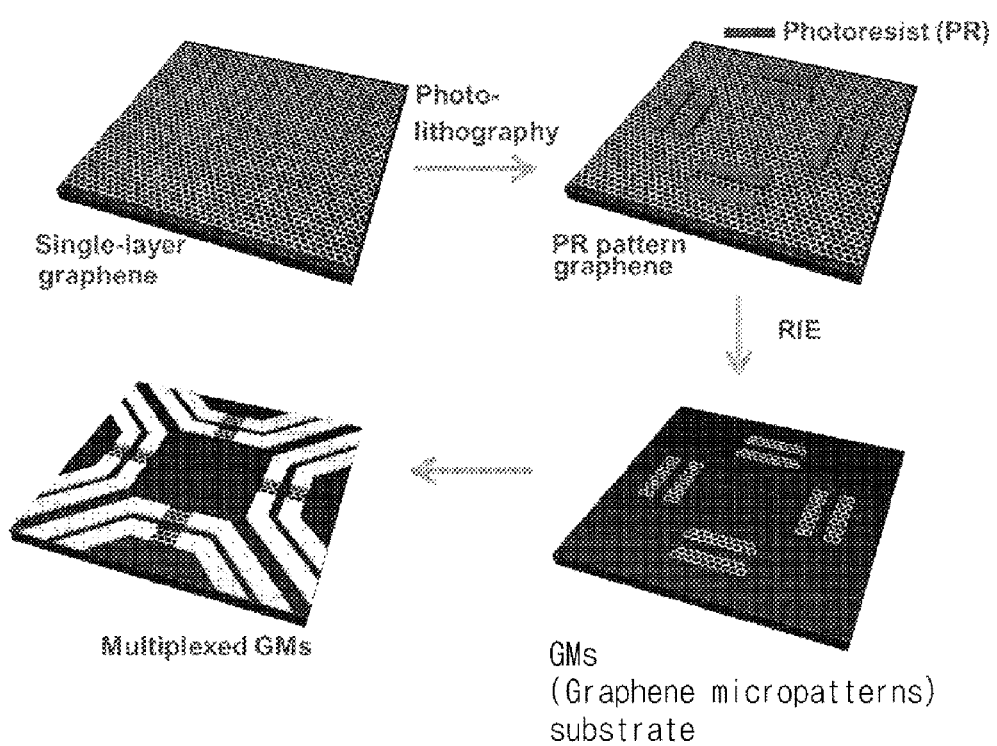

The linker layer is configured to bind a bioprobe unit to the graphene channel layer of the graphene transistor according to the present invention. As shown in FIGS. 3 and 4, the linker layer may be arranged on the graphene channel layer exposed between the pair of metals spaced apart from each other.

The linker layer may include an N-heterocyclic carbene compound.

Specifically, the N-heterocyclic carbene compound may be represented by the following Formula 1.

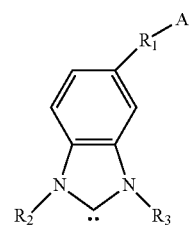

[Formula 1]

wherein A may be an azide group or a phthalimide group; and $R_1$ may be an alkylene group or an alkoxyalkylene group, which has 1 to 10 carbon atoms and contains 1 to 5 repeating units. In this case, $R_1$ is preferably an alkylene group or an alkoxyalkylene group, which has a 1 to 8 carbon atoms and contains 1 to 4 repeating units, and more preferably an alkoxyalkylene group, which has 2 to 5 carbon atoms and contains 1 to 4 repeating units, in terms of the sensitivity of the electrical conductivity of the graphene channel layer.

Also, $R_2$ and $R_3$ may be the same or different from each other, and may be any one selected from the group consisting of an alkyl group, a cycloalkyl group, an alkenyl group, an alkynyl group, an aryl group, an alkylene group, an alkenylene group, an alkynylene group, an alkoxy group, an arylalkyl group, and a benzyl group, each of which has 1 to 20 carbon atoms. In this case, $R_2$ and $R_3$ are each independently preferably any one selected from the group consisting of an alkyl group, a cycloalkyl group, an alkenyl group, and a benzyl group, each of which has 3 to 16 carbon atoms, and more preferably a cycloalkyl group or a benzyl group, each of which has 6 to 10 carbon atoms, in terms of the binding affinity of the graphene channel layer for the probe unit.

Figure 5:
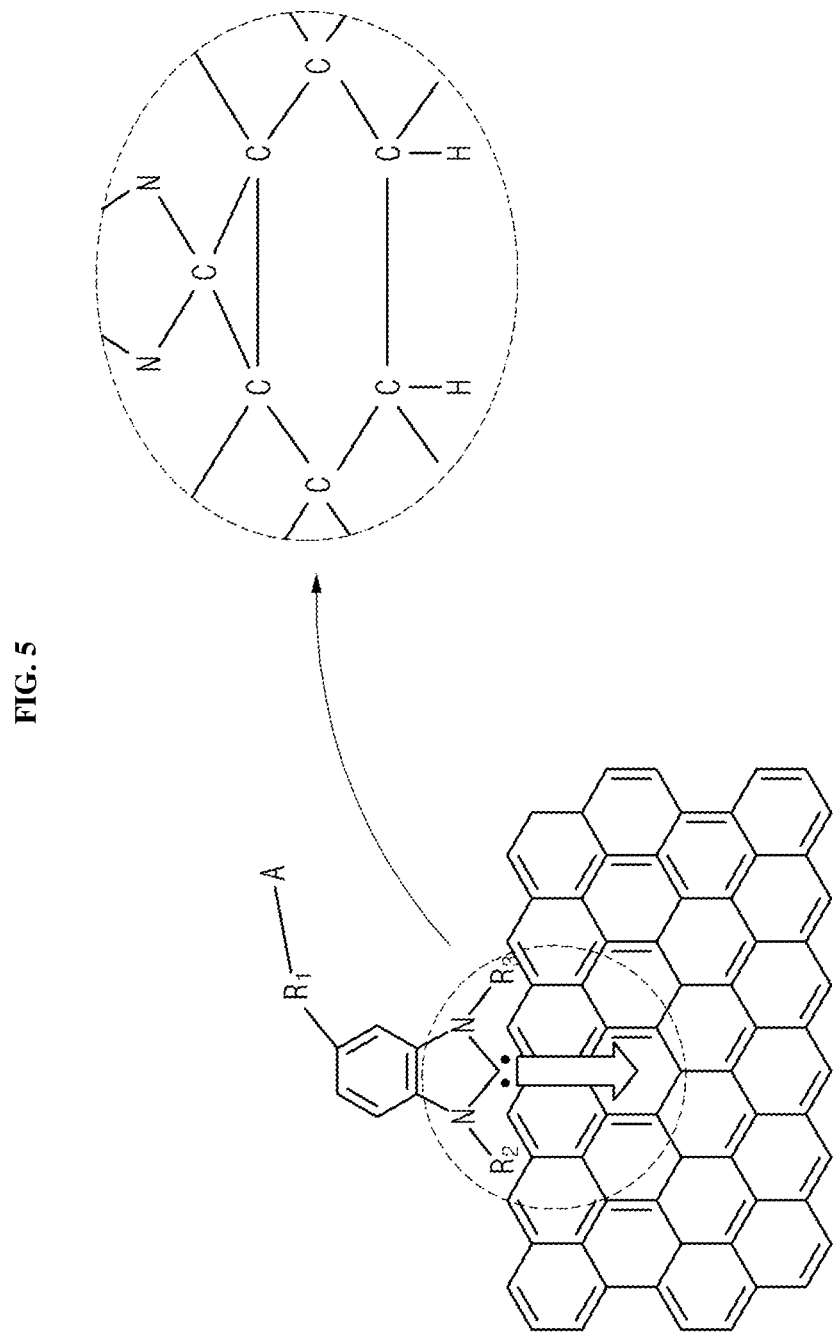
FIG. 5 is a schematic diagram showing that a carbene group of an N-heterocyclic carbene compound is covalently bound to graphene of a graphene channel layer.
Figure 6A:
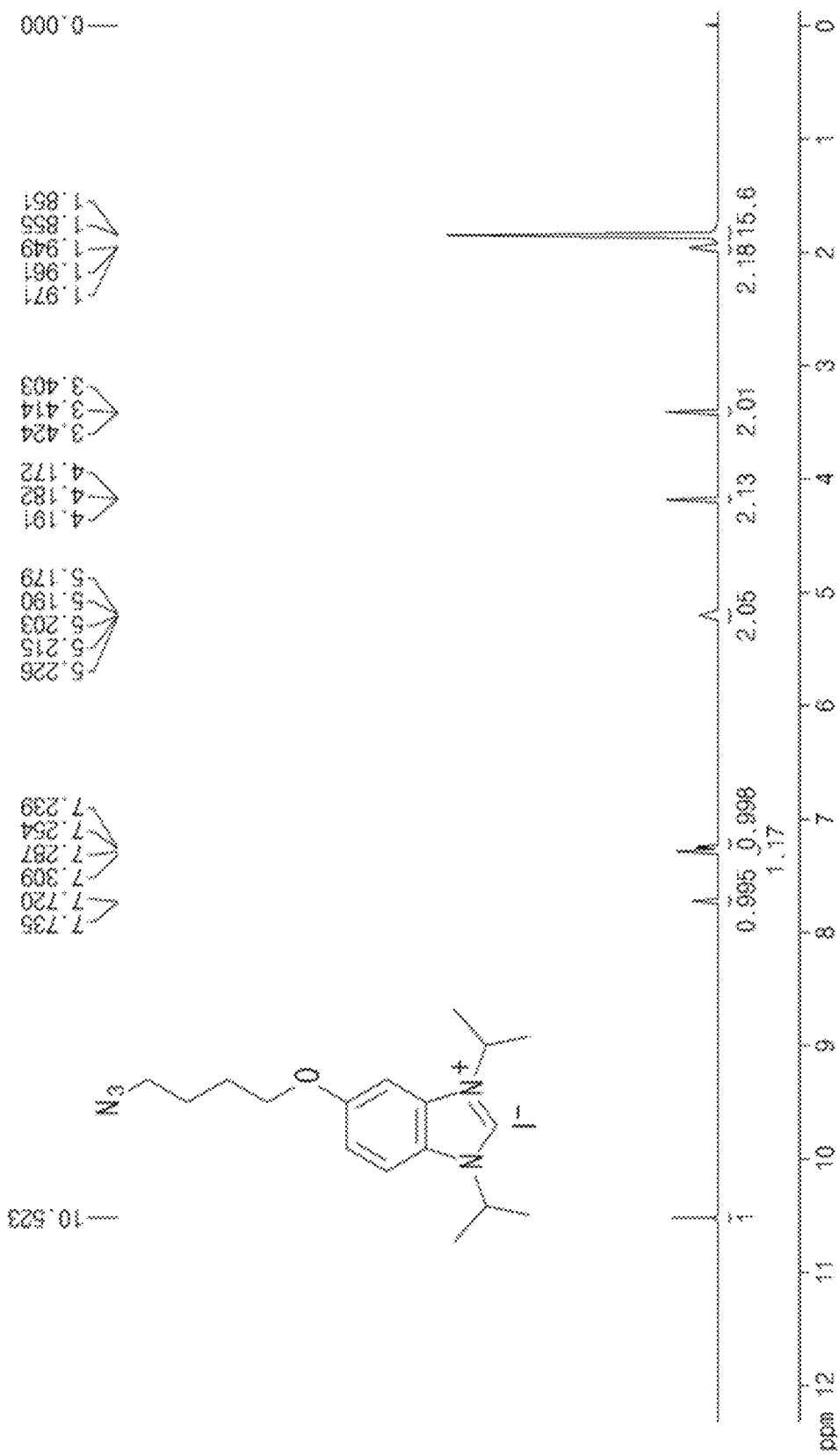
FIGS. 6A and 6B show the molecular formulas and nuclear magnetic resonance data of N-heterocyclic carbene compounds having a terminal region functionalized with an azide group and a phthalimide group, respectively.
Figure 6B:
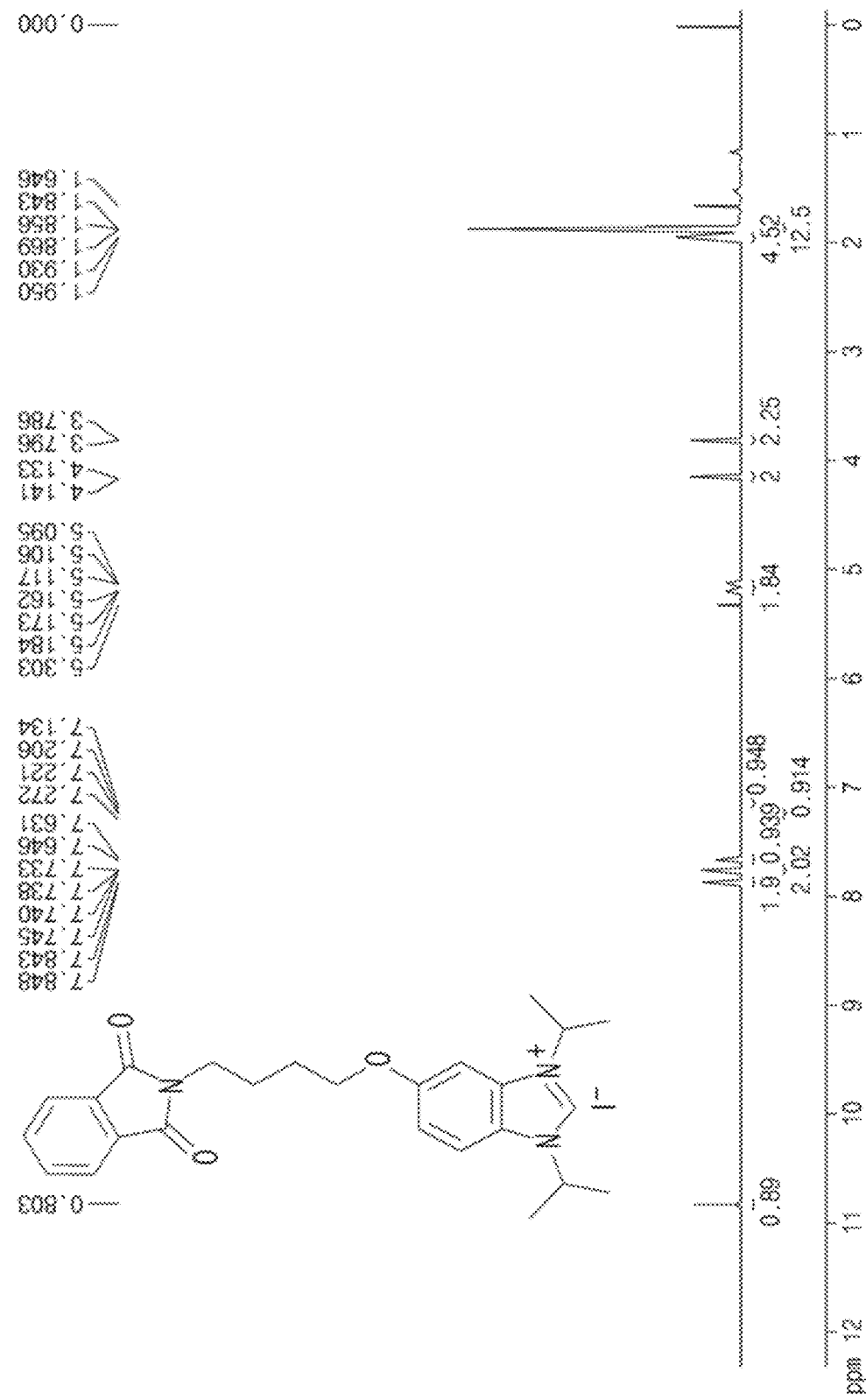
Figure 7:
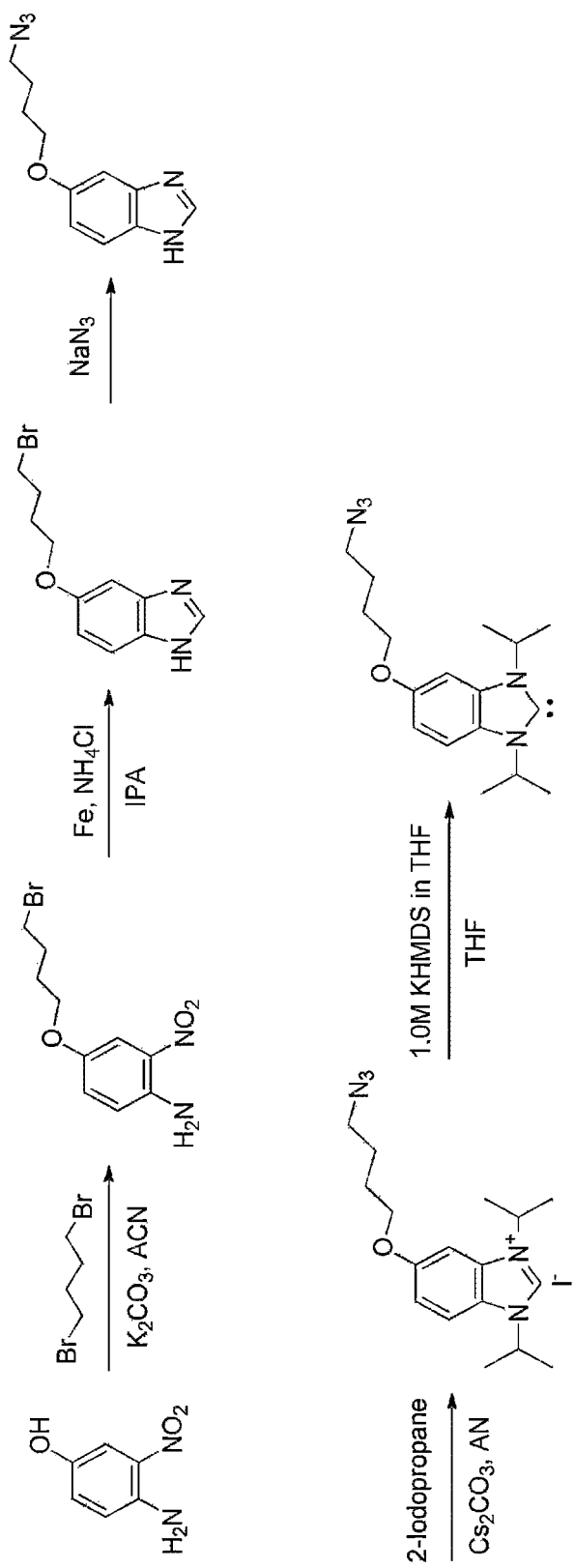
FIG. 7 is a scheme diagram showing the steps of a process of synthesizing an N-heterocyclic carbene compound (NHC1).
Figure 8:
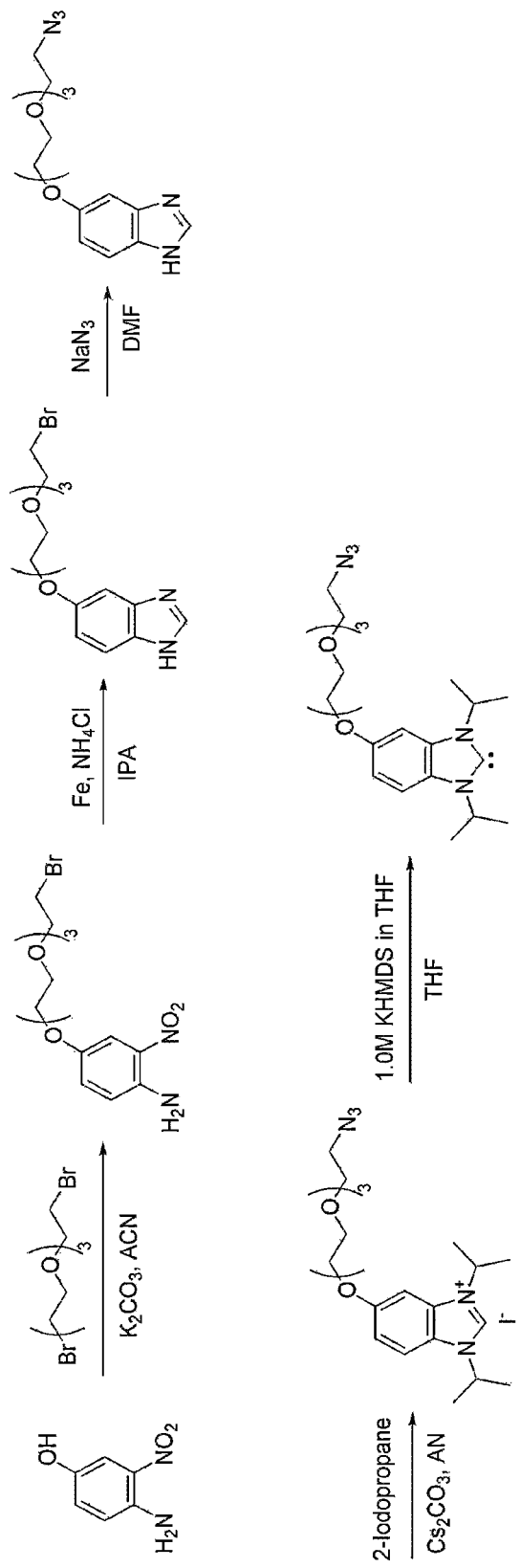
FIG. 8 is a scheme diagram showing the steps of a process of synthesizing an N-heterocyclic carbene compound (NHC2).
Figure 9:
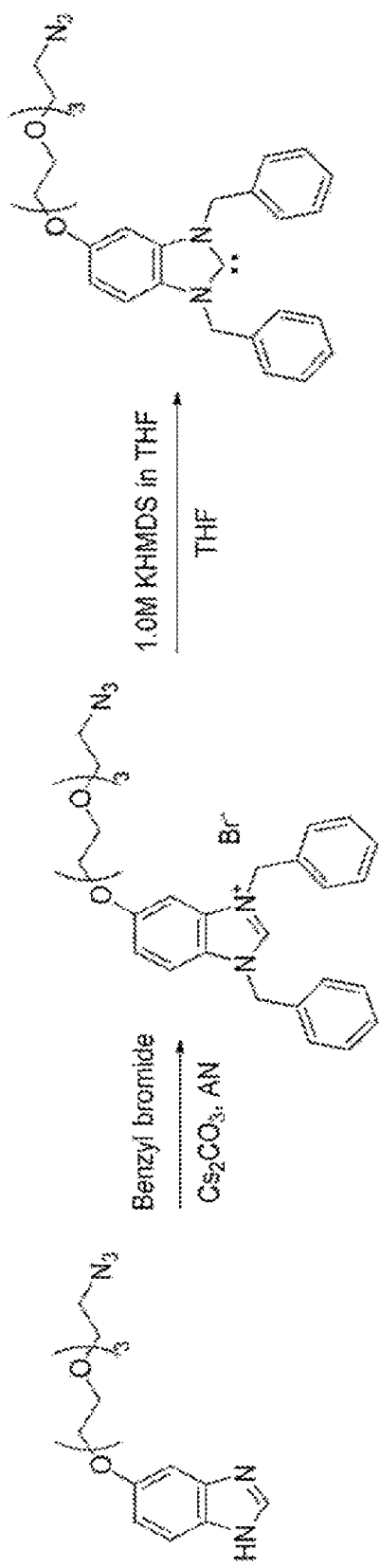
FIG. 9 is a scheme diagram showing the steps of a process of synthesizing an N-heterocyclic carbene compound (NHC3).
Figure 10:
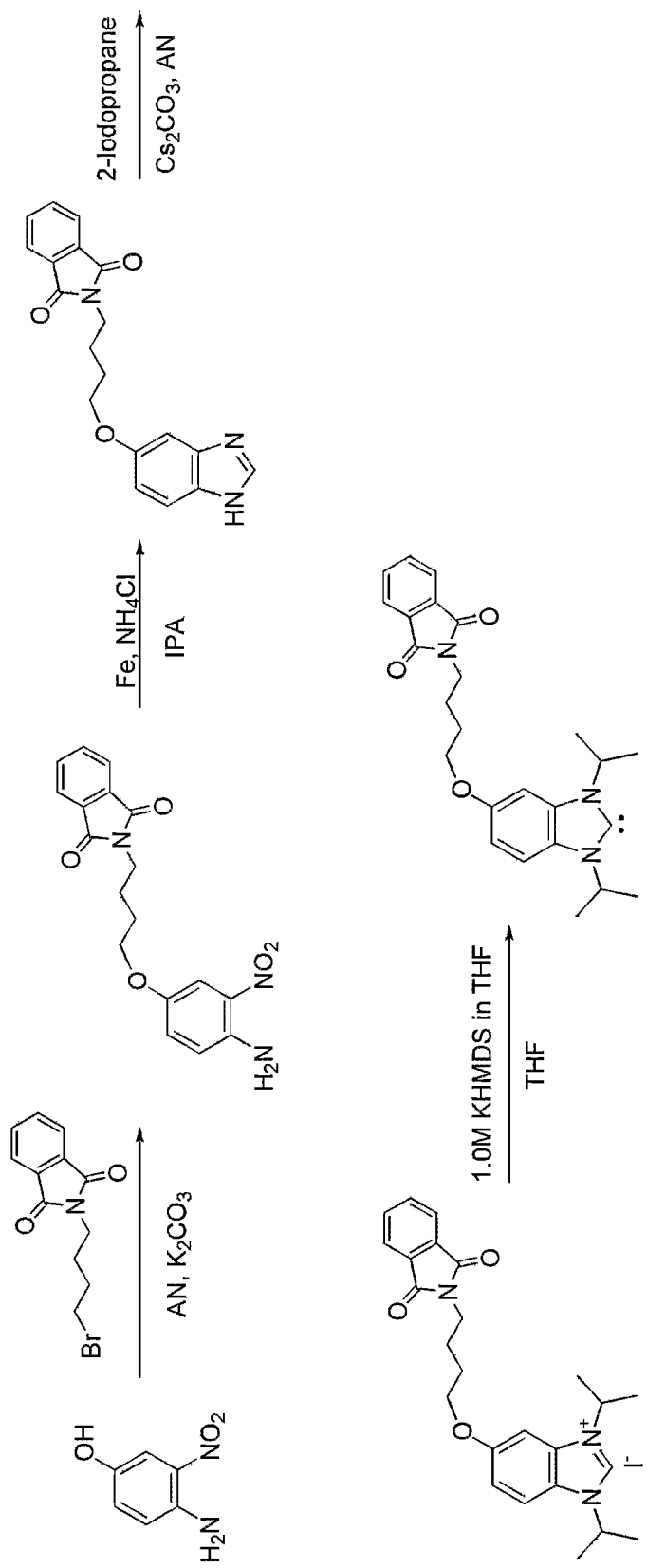
FIG. 10 is a scheme diagram showing the steps of a process of synthesizing an N-heterocyclic carbene compound (NHC4).
Figure 11:
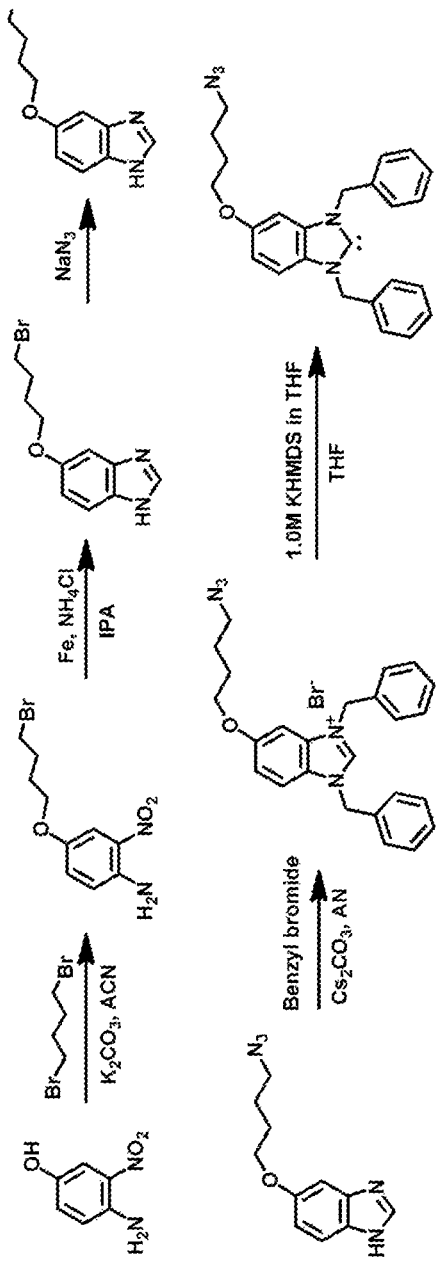
FIG. 11 is a scheme diagram showing the steps of a process of synthesizing an N-heterocyclic carbene compound (NHC5).

In the case of the N-heterocyclic carbene compound, as shown in FIG. 5, the carbene group may be bound to graphene of the graphene channel layer via a covalent bond.

As such, because the graphene channel layer forms a covalent bond with the carbene group of the N-heterocyclic carbene compound through self-bonding, the N-heterocyclic carbene compound has an effect of forming a band gap without any additional doping process and reducing noise caused by non-specific external charges. Also, the N-heterocyclic carbene compound has an effect of process simplification and cost saving because it does not require additional chemical treatment such as addition of a cross-linking agent, and the like.

Also, the N-heterocyclic carbene compound may have a terminal region (part A of Formula 1) functionalized with an azide group or a phthalimide group. As a result, the linker layer may bind to the bioprobe unit without any additional chemical reaction step.

The N-heterocyclic carbene compound preferably includes at least one selected from the group consisting of 6-4(-azidobutoxy)-1,3-diisopropyl-1H-benzo[d]imidazol-2-ylidene, 6-(2-(2-(2-(2-azidoethoxy)ethoxy)ethoxy)ethoxy)-1,3-diisopropyl-1H-benzo[d]imidazol-2-ylidene, 6-(2-(2-(2-(2-azidoethoxy)ethoxy)ethoxy)ethoxy)-1,3-dibenzyl-1H-benzo[d]imidazol-2-ylidene, 6-(4-(1,3-diisoindolin-2-yl) butoxy)-1,3-diisopropyl-1H-benzo[d]imidazol-2-ylidene, and 6-(4-azidobutoxy-1,3-dibenzyl-1H-benzo[d]imidazol-2-ylidene, and is more preferably 6-(2-(2-(2-(2-azidoethoxy)ethoxy)ethoxy)ethoxy)-1,3-dibenzyl-1H-benzo[d]imidazol-2-ylidene, or 6-(4-azidobutoxy-1,3-dibenzyl-1H-benzo[d]imidazol-2-ylidene.

A linker layer forming the N-heterocyclic carbene compound as described above may form a linker layer in the form of a single layer.

When the linker layer is formed in the form of a single layer of the N-heterocyclic carbene compound, there are not only excellent intrinsic characteristics of graphene, such as charge mobility, transmittance, and flexibility, but also an effect of blocking noise signals caused by the access of non-specific external charges.

Also, the linker layer may have a thickness of 0.1 nm to 1 nm. When the thickness of the linker layer is thinner than 0.1 nm, an increase in resistance may be caused. On the other hand, when the thickness of the linker layer is thicker than 1 nm, a decrease in transmittance may be caused.

2. Fabrication Method for Graphene Transistor

Another aspect of the present invention provides a fabrication method for a graphene transistor.

Referring to FIGS. 3 and 4, the fabrication method for a graphene transistor according to the present invention includes growing graphene on a substrate using a hydrocarbon gas as carbon source by means of a chemical vapor deposition method to form a graphene channel layer, forming a pair of metals on the graphene channel layer, and forming a linker layer on a surface of the graphene channel layer, which is exposed to the outside, using a surface treatment agent including an N-heterocyclic carbene compound.

Such a graphene channel layer may be, for example, formed using a chemical vapor deposition method. In this case, when the chemical vapor deposition method is used, a monolayer to several layers of graphene showing outstanding crystallinity may be obtained in a large area.

The chemical vapor deposition is a method of growing graphene by adsorbing a carbon precursor in the form of a gas or steam, which has high kinetic energy, onto a surface of a substrate, decomposing or reacting the carbon precursor to separate carbon atoms, and forming an interatomic bond between the corresponding carbon atoms.

According to the present invention, the chemical vapor deposition method may include at least one selected from the group consisting of plasma-enhanced chemical vapor deposition (PECVD), atmospheric pressure chemical vapor deposition (APCVD), and low pressure chemical vapor deposition (LPCVD). In this case, the chemical vapor deposition method is preferably LPCVD because it is possible to deposit by minimizing defects in a large area.

According to one specific method for the chemical vapor deposition, the graphene channel layer may be, for example, formed by depositing a metal catalyst (for example, nickel, copper, aluminum, iron, and the like) on a wafer including a silicon oxide layer using a sputtering apparatus and an electron beam evaporator to form a metal catalyst layer, putting the wafer into a reactor together with a carbon source such as $CH_4$, $C_2H_2$, and the like, heating the wafer and carbon source so that carbon atoms can be absorbed into the metal catalyst layer, cooling the wafer to separate the carbon atoms from the metal catalyst layer and crystallize the carbon atoms, and finally removing the metal catalyst layer from the wafer.

However, a method of forming the graphene channel layer is not limited to the chemical vapor deposition method. For example, the graphene channel layer may be formed using various methods.

For example, the graphene channel layer may be formed using a physical exfoliation method of preparing graphene by peeling one layer from graphite crystals composed of several layers using a mechanical force, a chemical exfoliation method using oxidation-reduction characteristics, or an epitaxial synthesis method of thermally treating a material, in which a carbon source such as SiC is included in or adsorbed into crystals, under a high-temperature condition of 1,500° C.

The pair of metals may be a source electrode and a drain electrode, which may be formed using methods known in the related art. For example, the source electrode and the drain electrode may be formed using deposition methods such as a thermal deposition process, an E-beam deposition process, PECVD, LPCVD, a physical vapor deposition (PVD) process, sputtering, ALD, and the like.

The forming of the linker layer on the surface of the graphene channel layer, which is exposed to the outside, may include forming a linker layer on a surface of a substrate having a graphene channel layer formed thereon by immersing the substrate in an N-heterocyclic carbene compound solution at room temperature for a predetermined period of time in the presence of argon.

In the case of the graphene channel layer and the linker layer, a surface of the graphene channel layer may be modified by reacting for 5 to 300 seconds without any additional chemical reaction step. The reaction is preferably performed for 20 to 60 seconds in terms of enhancing convenience of fabrication and saving fabrication costs. This has an advantage in that it is more simple and faster than the methods known in the related art.

The N-heterocyclic carbene compound constituting the linker layer may be formed using a synthesis method as shown in FIGS. 7 to 11. According to the present invention, the N-heterocyclic carbene compound may be synthesized using an imidazolium salt as a source.

That is, in the present invention, a graphene transistor is fabricated from an N-heterocyclic carbene compound having a cyclic structure using an imidazolium salt as the source in terms of easy reactivity for surface modification of the graphene channel layer.

When a carbene compound having no cyclic structure is used, reaction conditions for modifying a surface of the graphene channel layer are very strict, and an effect of external charges may not be completely blocked because it is impossible to modify the entire surface of the graphene channel layer. Also, because electrons provided by the carbene compound having no cyclic structure tend to persistently accumulate in the graphene channel layer to degrade the stability of the graphene channel layer itself, the electrons may be separated again from the graphene channel layer when the carbene compound is used at an amount higher than a predetermined amount.

3. Biosensor

Still another aspect of the present invention provides a biosensor including the graphene transistor as described above.

The biosensor according to the present invention uses a semiconductor characteristic of a current flowing through the graphene channel layer between source and drain electrodes changing in response to an electric field.

Specifically, when a probe included in a bioprobe unit formed on a surface of the graphene channel layer reacts with a target, a change in an electric field around the probe occurs. As a result, a value of current flowing through a graphene channel region between the source electrode and the drain electrode also changes. In this case, the target is detected by measuring this change in current.

Such a biosensor shows excellent sensitivity, specificity, speed, and portability when the graphene transistor as described above is used in the biosensor. In particular, the biosensor shows excellent sensitivity and real-time detection performance due to the high charge carrier mobility and conductivity characteristics of graphene when the graphene is used in the channel layer.

Also, when the linker layer as described above is formed on the graphene channel layer in the transistor so that a bioprobe unit binding to the linker layer is present in a channel region of the transistor, sensitivity of the biosensor may be further improved, and a doping process and attachment of the bioprobe may be performed at the same time, thereby simplifying a process.

The fabrication method for such a biosensor may include doping the graphene channel layer and binding a bioprobe unit to the linker layer.

That is, in the case of the graphene transistor included in the biosensor, a band gap is formed by modifying a surface of the graphene channel layer with an N-heterocyclic carbene compound. Therefore, a separate doping process for forming a band gap is not required, but a doping process for regulating band gap energy is required in terms of operating efficiency and reliability.

In this case, the doping process may include at least one selected from the group consisting of substitutional doping, chemical doping, and surface charge transfer doping.

Among these, the substitutional doping is a method of substituting a carbon atom with boron or nitrogen. More specifically, the substitutional doping is a method of allowing a gas including boron (i.e., $HBO_3$, $H_2B_6$) and a gas including nitrogen (i.e., $NH_3$) to flow with methane to synthesize graphene substituted with boron and nitrogen or thermally treating the gas or applying plasma to the gas at a high temperature while allowing the gas to flow when graphene is synthesized using a chemical vapor deposition method.

In particular, when the gas is allowed to flow while thermally treating the gas at a high temperature, graphene oxide may be reduced and substituted at the same time. Therefore, this method has an advantage in that a doping degree may be regulated by reducing the intensity of plasma and an amount of the gas.

The chemical doping is a method of changing a work function of graphene using chemicals. In this case, the graphene may be changed into the p type or n type depending on the chemicals used. In particular, gold chloride is preferably used.

This chemical doping has an advantage in that a doping degree may be easily regulated without changing the mechanical and chemical properties of a target material.

Meanwhile, when a material rich or deficient in electrons is present on a surface of graphene, an electron state of graphene may vary by depriving electrons from graphene or transferring electrons to graphene. The surface charge transfer doping is a method using this.

That is, when a structure of graphene is formed by coating with or through deposition of a molecule capable of inducing the charge transfer, the charge transfer spontaneously occurs due to a difference in electronegativity from carbon constituting graphene. This is a method of doping graphene.

An adsorbent material inducing the transfer of surface charges may, for example, include tetrafluorotetracyanoquinodimethane (F4-TCNQ) and a fluoropolymer (CYTOP).

Also, the binding of the bioprobe unit to the linker layer may be performed by modifying a surface of the graphene channel layer with an N-heterocyclic carbene compound to form a linker layer and reacting a functional group (for example, an azide group or a phthalimide group) of the N-heterocyclic carbene compound constituting the linker layer with a bioprobe unit (for example, an aptamer, an antibody, or the like) in a state in which the functional group of the N-heterocyclic carbene compound is exposed at an upper surface of the linker layer.

Meanwhile, the doping of the graphene channel layer and the binding of the bioprobe unit to the linker layer may be performed at the same time.

In the prior art, a graphene channel layer is first doped, and then subjected to additional chemical treatment to modify a surface of the graphene channel layer, and a bioprobe unit is attached to the graphene channel layer to fabricate a biosensor.

On the contrary, according to the present invention, the bioprobe unit is directly bound to the N-heterocyclic carbene compound. Therefore, the present invention exhibits an effect of improving economic feasibility due to process simplification because the doping of the graphene channel layer and the attachment of the bioprobe unit may be performed at the same time.

Meanwhile, the bioprobe unit may include a probe material including one or more selected from the group consisting of an aptamer, DNA, an antigen, an antibody, and a peptide.

Here, the aptamer refers to a peptide molecule that is synthesized from RNA, DNA, synthetic nucleotides, and the like, and may be synthesized with a certain base sequence so that the aptamer can selectively bind to a target material.

Figure 13:
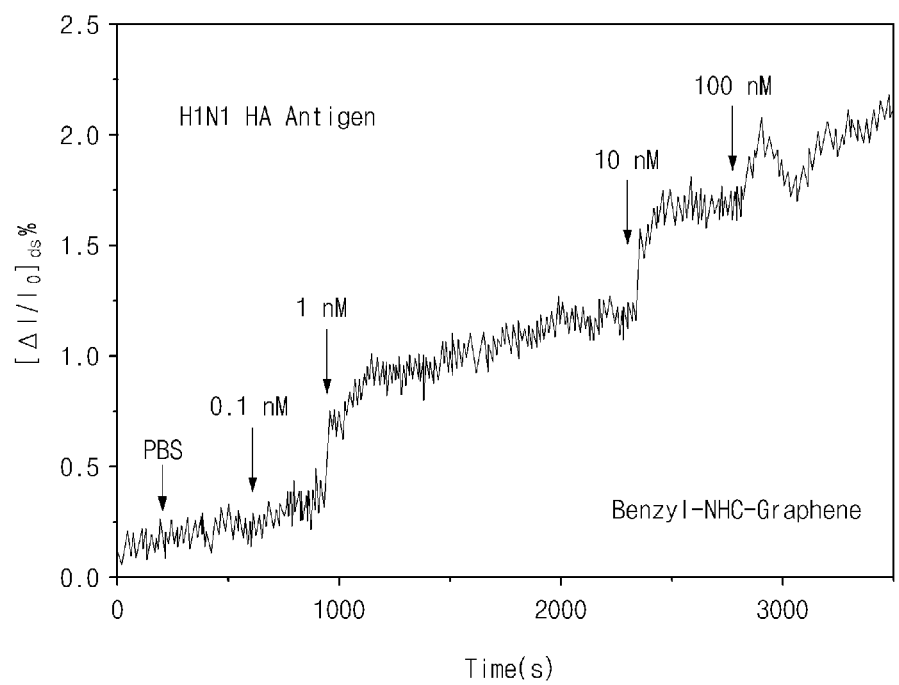
FIG. 13 a graph illustrating a real-time response of a biosensor including a graphene transistor to an H1N1 HA antigen.
Figure 14:
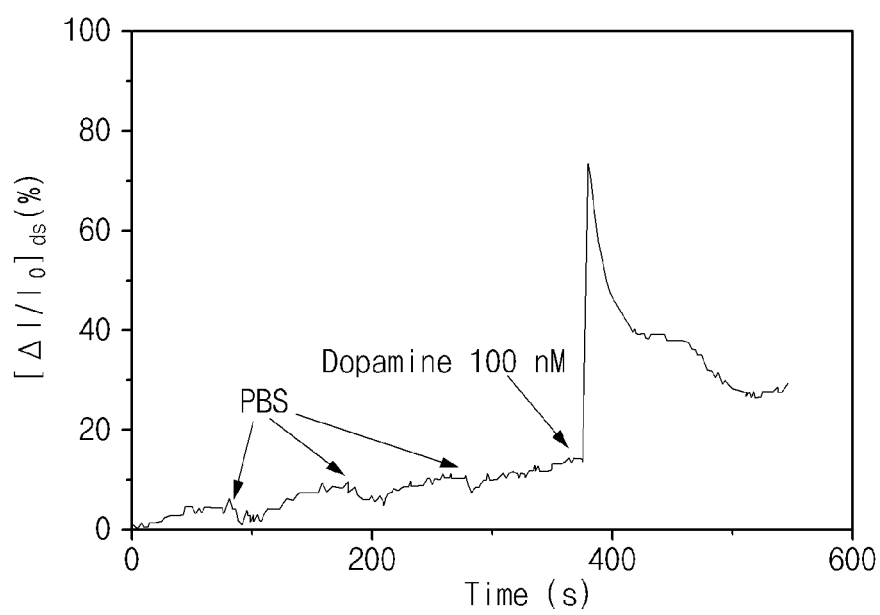
FIG. 14 a graph illustrating a real-time response of the biosensor including a graphene transistor to dopamine.

As one example, the biosensor according to the present invention may use the probe material to detect an antigen or an antibody of H1N1 HA or dopamine, as shown in FIGS. 13 and 14.

MODE FOR INVENTION

Hereinafter, the present invention will be described in further detail with reference to preferred embodiments thereof.

However, it should be understood that these embodiments disclosed herein are intended to describe the present invention in detail and not intended to limit the scope of the present invention

[Preparation Examples] Synthesis of
N-Heterocyclic Carbene Compound Having
Functionalized Terminal Region

[Preparation Example 1] Synthesis of 6-(4-azidobutoxy-1,3-diisopropyl-1H-benzo[d]imidazol-2-ylidene (Hereinafter Referred to as "NHC1")

Step 1: Synthesis of
4-(4-bromobutoxy)-2-nitroaniline $K_2CO_3$ (1.8 g, 13.0 mmol) was added to a solution of anhydrous acetonitrile (65 mL) including 4-amino-3-nitrophenol (2.0 g, 13.0 mmol) and 1,4-dibromobutane (3.64 g, 16.9 mmol). The reaction mixture was stirred at 80° C. for 12 hours in the presence of argon. After the reaction mixture was cooled to room temperature, an inorganic precipitate was filtered, and washed with acetonitrile (50 mL). Thereafter, the solvent was evaporated, and the resulting crude product was purified by silica column chromatography using an n-hexane:ethyl acetate gradient mixture.

In this case, the yield was 2.5 g (67%), and the NMR results were as follows: $^1$H NMR (600 MHz, CDDl$_3$): ESI-MS (m/z) for 6 $C_{10}H_{13}BrN_2O_3$: 288.01, Calc.: 288.01.

Step 2: Synthesis of 5-(4-bromobutoxy)-1H-benzo[d]imidazole

Formic acid (45 mL) was added to isopropyl alcohol (60 mL) including 4-(4-bromobutoxy)-2-nitroaniline (2.5 g, 8.65 mmol), iron powder (4.8 g, 86.5 mmol), and ammonium chloride (4.6 g, 86.5 mmol). The reaction mixture was stirred at 90° C. for 16 hours in the presence of argon, cooled to room temperature, and then filtered through a sintered glass filter. The resulting solids were washed with isopropyl alcohol (3×50 mL). The filtered liquid was dried by evaporation, and neutralized to pH 7 by adding a saturated sodium bicarbonate solution. Thereafter, the suspension was extracted with methylene chloride (3×100 mL). An organic layer was dried over sodium sulfate, and the solvent was evaporated. Then, the crude product was purified by silica column chromatography using a methylene chloride: methanol gradient mixture.

In this case, the yield was 1.86 g (80%), and the NMR results were as follows: $^1$H NMR (600 MHz, CDDl$_3$): ESI-MS (m/z) for δ $C_{11}H_{13}BrN_2O$: 269.14, Calc.: 269.14.

Step 3: Synthesis of 5-(4-azidobutoxy)-1H-benzo[d]imidazole 5-(4-bromobutoxy)-1H-benzo[d]imidazole (1.86 g, 6.91 mmol) was stirred with sodium azide (NaN$_3$, 0.49 g, 7.6 mmol) in N,N-dimethylformamide (35 mL) at 80° C. for 8 hours in the presence of argon. The reaction mixture was added to water (200 mL), and extracted with ethyl acetate (2×150 mL). The combined organic layers were dried over sodium sulfate, and the solvent was evaporated. Thereafter, the crude product was purified by silica column chromatography using a methylene chloride: methanol gradient mixture.

In this case, the yield was 1.4 g (88%), and the NMR results were as follows: $^1$H NMR (600 MHz, CDDl$_3$): ESI-MS (m/z) for δ $C_{11}H_{13}N_5O$: 231.25, Calc.: 231.26.

Step 4: Synthesis of 5-(4-Azidobutoxy)-1,3-Diisopropyl-1H-Benzo[d]Imidazol-3-Ium Iodide 2-Iodopropane (15.1 mL, 151 mmol) was added to a suspension of 5-(4-azidobutoxy)-1H-benzo[d]imidazole (1.4 g, 6.05 mmol) and cesium carbonate (Cs$_2$CO$_3$, 1.97 g, 6.05 mmol) in acetonitrile (60 mL). The reaction mixture was stirred at 90° C. for 24 hours in the presence of argon. Thereafter, excessive amounts of the 2-iodopropane and the solvent were evaporated under vacuum. The crude product was purified by silica column chromatography using a methylene chloride: methanol gradient mixture.

In this case, the yield was 1.8 g (67%), and the NMR results were as follows: $^1$H NMR (600 MHz, CDDl$_3$): ESI-MS (m/z) for δ $C_{17}H_{26}N_5OI$: 316.20, Calc.: 316.21.

Step 5: Synthesis of NHC1

5-(4-Azidobutoxy)-1,3-diisopropyl-1H-benzo[d]imidazol-3-ium iodide (80 mg, 0.18 mmol) was dissolved in anhydrous THF (3.6 mL), and stirred in a glove box to obtain a precarbene. As a blank solution, 1 M KHMDS (0.18 mL, 0.18 mmol) in THF was added dropwise to the mixture at room temperature, and then stirred for 15 minutes. It was able to be observed that a white precipitate (KI) was immediately formed. The resulting mixture was filtered through a 0.2 μm PTFE syringe filter, and diluted with a carbene with a concentration of 0.05 M to fabricate NHC1.

[Preparation Example 2] Synthesis of 6-(2-(2-(2-(2-azidoethoxy)ethoxy)ethoxy)ethoxy)-1,3-diisopropyl-1H-benzo[d]imidazol-2-ylidene (Hereinafter Referred to as "NHC2")

Step 1: Synthesis of 4-(2-(2-(2-(2-bromoethoxy)ethoxy)ethoxy)ethoxy)-2-nitroaniline K$_2$CO$_3$ (1.8 g, 13.0 mmol) was added to a solution of anhydrous acetonitrile (65 mL) including 4-amino-3-nitrophenol (2.0 g, 13.0 mmol) and 1-bromo-2-(2-(2-(2-bromoethoxy)ethoxy)ethoxy)ethane (6.24 g, 19.5 mmol). The reaction mixture was stirred at 80° C. for 12 hours in the presence of argon. After the reaction mixture was cooled to room temperature, the inorganic precipitate was filtered, and washed with acetonitrile (80 mL). Thereafter, the solvent was evaporated, and the crude product was purified by silica column chromatography using an n-hexane:ethyl acetate gradient mixture to obtain a product.

In this case, the yield was 3.8 g (75%), and the NMR results were as follows: $^1$H NMR (600 MHz, CDDl$_3$): ESI-MS (m/z) for δ $C_{14}H_{21}BrN_2O_4$: 393.06, Calc.: 393.07.

Step 2: Synthesis of 5-(2-(2-(2-(2-bromoethoxy)ethoxy)ethoxy)ethoxy)-1H-benzo[d]imidazole Formic acid (48 mL) was added to isopropyl alcohol (70 mL) including 4-(2-(2-(2-(2-bromoethoxy)ethoxy)ethoxy)ethoxy-2-nitroaniline (3.8 g, 9.66 mmol), iron powder (5.40 g, 96.6 mmol), and ammonium chloride (5.16 g, 96.6 mmol). The reaction mixture was stirred at 90° C. for 20 hours in the presence of argon, cooled to room temperature, and then filtered through a sintered glass filter. The resulting solids were washed with isopropyl alcohol (3×50 mL). The filtered liquid was dried by evaporation, and neutralized to pH 7 by adding a saturated sodium bicarbonate solution. Thereafter, the suspension was extracted with methylene chloride (3×100 mL). An organic layer was dried over sodium sulfate, and the solvent was evaporated. Then, the crude product was purified by silica column chromatography using a methylene chloride: methanol gradient mixture.

In this case, the yield was 2.8 g (78%), and the NMR results were as follows: $^1$H NMR (600 MHz, CDDl$_3$): ESI-MS (m/z) for 6 $C_{15}H_{31}BrN_2O_4$: 372.06, Calc.: 372.07.

Step 3: Synthesis of 5-(2-(2-(2-(2-azidoethoxy)ethoxy)ethoxy)ethoxy)-1H-benzo[d]imidazole 5-(2-(2-(2-(2-Bromoethoxy)ethoxy)ethoxy)ethoxy-1H-benzo[d]imidazole (2.8 g, 7.5 mmol) was stirred with sodium azide (NaN$_3$, 0.536 g, 8.25 mmol) in N,N-dimethylformamide (40 mL) at 80° C. for 8 hours in the presence of argon. The reaction mixture was added to water (200 mL), and extracted with EtOAc (2×150 mL). An organic layer was dried over sodium sulfate, and the solvent was evaporated. Then, the crude product was purified by silica column chromatography using a methylene chloride: methanol gradient mixture.

In this case, the yield was 2.0 g (80%), and the NMR results were as follows: $^1$H NMR (600 MHz, CDDl$_3$): ESI-MS (m/z) for δ $C_{15}H_{21}N_5O_4$: 335.15, Calc.: 335.16.

Step 4: Synthesis of 5-(2-(2-(2-(2-azidoethoxy)ethoxy)ethoxy)-1,3-diisopropyl-1H-benzo[d]imidazol-3-ium iodide 2-Iodopropane (14 mL, 141 mmol) was added to a suspension of 5-(2-(2-(2-(2-azidoethoxy)ethoxy)ethoxy)-1H-benzo[d]imidazole (1.9 g, 5.66 mmol) and cesium carbonate (1.84 g, 5.66 mmol) in acetonitrile (60 mL). The reaction mixture was stirred at 90° C. for 24 hours in the presence of argon. Thereafter, excessive amounts of the 2-iodopropane and the solvent were evaporated under vacuum. The crude product was purified by silica column chromatography using a dichloromethane:methanol gradient mixture.

In this case, the yield was 2.1 g (70%), and the NMR results were as follows: $^1$H NMR (600 MHz, CDDl$_3$): ESI-MS (m/z) for δ $C_2H_{34}N_5O_4$: 420.26, Calc.: 420.26.

Step 5: Synthesis of NHC2

5-(2-(2-(2-(2-azidoethoxy)ethoxy)ethoxy)ethoxy)-1,3-diisopropyl-1H-benzo[d]imidazol-3-ium iodide (80 mg, 0.15 mmol) was dissolved in anhydrous THF (3 mL), and stirred in a glove box to obtain a precarbene. As a blank solution, 1 M KHMDS (0.15 mL, 0.15 mmol) in THF was added dropwise to the mixture at room temperature, and stirred for 15 minutes. It was able to be observed that a white precipitate (KI) was immediately formed. The resulting mixture was filtered through a 0.2 μm PTFE syringe filter, and diluted with a carbene with a concentration of 0.05 M to fabricate NHC2.

[Preparation Example 3] Synthesis of 6-(2-(2-(2-(2-azidoethoxy)ethoxy)ethoxy)ethoxy)-1,3-dibenzyl-1H-benzo[d]imidazol-2-ylidene (Hereinafter Referred to as "NHC3")

Step 1: Synthesis of 5-(2-(2-(2-(2-azidoethoxy)ethoxy)ethoxy)ethoxy)-1,3-dibenzyl-1H-benzo[d]imidazol-3-ium bromide Benzyl bromide (11 mL, 82 mmol) was added to a suspension of 5-(2-(2-(2-(2-azidoethoxy)ethoxy)ethoxy)ethoxy)-1,3-dibenzyl-1H-benzo[d]imidazole (1.2 g, 3.58 mmol) and cesium carbonate (1.17 g, 3.58 mmol) in acetonitrile (36 mL). The reaction mixture was stirred at 90° C. for 24 hours in the presence of argon. Thereafter, an excessive amount of benzyl bromide was evaporated under vacuum. The crude product was purified by silica column chromatography using a dichloromethane:methanol gradient mixture.

In this case, the yield was 1.7 g (80%), and the NMR results were as follows: $^1$H NMR (600 MHz, CDDl$_3$): ESI-MS (m/z) for δ $C_{29}H_{34}N_5O_4$: 516.26, Calc.: 516.26.

Step 2: Synthesis of NHC3

5-(2-(2-(2-(2-Azidoethoxy)ethoxy)ethoxy)ethoxy)-1,3-dibenzyl-1H-benzo[d]imidazol-3-ium bromide (90 mg, 0.15 mmol) was dissolved in anhydrous THF (3 mL), and stirred in a glove box to obtain a precarbene. As a blank solution, 1 M KHMDS THF (0.15 mL, 0.15 mmol) in THF was added dropwise to the mixture at room temperature, and stirred for 15 minutes. It was able to be observed that a white precipitate (KBr) was immediately formed. The resulting mixture was filtered through a 0.2 μm PTFE syringe filter, and diluted with a carbene with a concentration of 0.05 M to fabricate NHC3.

[Preparation Example 4] Synthesis of 6-(4-(1,3-diisoindolin-2-yl)butoxy)-1,3-diisopropyl-1H-benzo[d]imidazol-2-ylidene (Hereinafter Referred to as "NHC4")

Step 1: Synthesis of 2-(4-(4-amino-3-nitrophenoxy)butoxy)isoindoline-1,3-dione $K_2CO_3$ (1.8 g, 13.0 mmol) was added to a solution of anhydrous acetonitrile (65 mL) including 4-amino-3-nitrophenol (2.0 g, 13.0 mmol) and N-(4-bromobutyl)phthalimide (4.03 g, 14.3 mmol). The reaction mixture was stirred at 80° C. for 12 hours in the presence of argon. After the reaction mixture was cooled to room temperature, the inorganic precipitate was filtered, and washed with acetonitrile (50 mL). Thereafter, the solvent was evaporated, and the crude product was purified by silica column chromatography using an n-hexane:ethyl acetate gradient mixture.

In this case, the yield was 3.65 g (79%), and the NMR results were as follows: $^1$H NMR (600 MHz, CDDl$_3$): ESI-MS (m/z) for δ $C_{18}H_{17}N_3O_5$: 355.11, Calc.: 355.12.

Step 2: Synthesis of 2-(4-((1H-benzo[d]imidazol-5-yl)oxy)butyl)isoindoline-1,3-dione Formic acid (45 mL) was added to isopropyl alcohol (60 mL) including 2-(4-(4-amino-3-nitrophenoxy)butoxy)isoindoline-1,3-dione (3.0 g, 8.44 mmol), iron powder (4.71 g, 84.4 mmol), and ammonium chloride (4.51 g, 84.4 mmol). The reaction mixture was stirred at 90° C. for 16 hours in the presence of argon, cooled to room temperature, and then filtered through a sintered glass filter. The resulting solids were washed with isopropyl alcohol (3×60 mL). The filtered liquid was dried by evaporation, and neutralized to pH 7 by adding a saturated sodium bicarbonate solution. Thereafter, the suspension was extracted with methylene chloride (3×100 mL). An organic layer was dried over sodium sulfate, and the solvent was evaporated. Then, the crude product was purified by silica column chromatography using a methylene chloride: methanol gradient mixture.

In this case, the yield was 2.1 g (75%), and the NMR results were as follows: $^1$H NMR (600 MHz, CDDl$_3$): ESI-MS (m/z) for δ $C_{11}H_{13}BrN_2O$: 335.13, Calc.: 335.13.

Step 3: Synthesis of 5-(4-(1,3-Dioxoisoindolin-2-Yl)Butoxy)-1,3-Diisopropyl-1H-Benzo[d]Imidazol-3-Ium Iodide 2-Iodopropane (15 mL, 149 mmol) was added to a suspension of 2-(4-((1H-benzo[d]imidazol-5-yl)oxy)butyl)isoindoline-1,3-dione (2.0 g, 5.96 mmol) and cesium carbonate ($Cs_2CO_3$, 1.94 g, 5.96 mmol) in acetonitrile (60 mL). The reaction mixture was stirred at 90° C. for 24 hours in the presence of argon. Thereafter, excessive amounts of the 2-iodopropane and the solvent were evaporated under vacuum. The crude product was purified by silica column chromatography using a methylene chloride: methanol gradient mixture.

In this case, the yield was 2.1 g (65%), and the NMR results were as follows: $^1$H NMR (600 MHz, CDDl$_3$): ESI-MS (m/z) for δ C$_{17}$H$_{26}$N$_5$O$_1$: 420.23, Calc.: 420.23.

Step 4: Synthesis of NHC4

5-(4-(1,3-Dioxoisoindolin-2-yl)butoxy)-1,3-diisopropyl-1H-benzo[d]imidazol-3-ium iodide (99 mg, 0.18 mmol) was dissolved in anhydrous THF (3.6 mL), and stirred in a glove box to obtain a precarbene. As a blank solution, 1 M KHMDS (0.18 mL, 0.18 mmol) in THF was added dropwise to the mixture at room temperature, and stirred for 15 minutes. It was able to be observed that a white precipitate (KI) was immediately formed. The resulting mixture was filtered through a 0.2 μm PTFE, syringe filter, and diluted with a carbene with a concentration of 0.05 M to fabricate NHC4.

[Preparation Example 5] Synthesis of 6-(4-azidobutoxy-1,3-dibenzyl-1H-benzo[d]imidazol-2-ylidene (Hereinafter Referred to as "NHC5")

Step 1: Synthesis of 4-(4-bromobutoxy)-2-nitroaniline

K$_2$CO$_3$ (1.8 g, 13.0 mmol) was added to a solution of anhydrous acetonitrile (65 mL) including 4-amino-3-nitrophenol (2.0 g, 13.0 mmol) and 1,4-dibromobutane (3.64 g, 16.9 mmol). The reaction mixture was stirred at 80° C. for 12 hours in the presence of argon. After the reaction mixture was cooled to room temperature, the inorganic precipitate was filtered, and washed with acetonitrile (50 mL). Thereafter, the solvent was evaporated, and the crude product was purified by silica column chromatography using an n-hexane:ethyl acetate gradient mixture.

In this case, the yield was 2.5 g (67%), and the NMR results were as follows: $^1$H NMR (600 MHz, CDDl$_3$): ESI-MS (m/z) for 6 C$_{10}$H$_{13}$BrN$_2$O$_3$: 288.01, Calc.: 288.01.

Step 2: Synthesis of 5-(4-bromobutoxy)-1H-benzo[d]imidazole

Formic acid (45 mL) was added to isopropyl alcohol (60 mL) including 4-(4-bromobutoxy)-2-nitroaniline (2.5 g, 8.65 mmol), iron powder (4.8 g, 86.5 mmol), and ammonium chloride (4.6 g, 86.5 mmol). The reaction mixture was stirred at 90° C. for 16 hours in the presence of argon, cooled to room temperature, and then filtered through a sintered glass filter. The resulting solids were washed with isopropyl alcohol (3×50 mL). The filtered liquid was dried by evaporation, and neutralized to pH 7 by adding a saturated sodium bicarbonate solution. Thereafter, the suspension was extracted with methylene chloride (3×100 mL). An organic layer was dried over sodium sulfate, and the solvent was evaporated. Then, the crude product was purified by silica column chromatography using a methylene chloride: methanol gradient mixture.

In this case, the yield was 1.86 g (80%), and the NMR results were as follows: $^1$H NMR (600 MHz, CDDl$_3$): ESI-MS (m/z) for 6 C$_{11}$H$_{13}$BrN$_2$O: 269.14, Calc.: 269.14.

Step 3: Synthesis of 5-(4-azidobutoxy)-1H-benzo[d]imidazole 5-(4-Bromobutoxy)-1H-benzo[d]imidazole (1.86 g, 6.91 mmol) was stirred with sodium azide (NaN$_3$, 0.49 g, 7.6 mmol) in N,N-dimethylformamide (35 mL) at 80° C. for 8 hours in the presence of argon. The reaction mixture was added to water (200 mL), and extracted with ethyl acetate (2×150 mL). The combined organic layers were dried over sodium sulfate, and the solvent was evaporated. Then, the crude product was purified by silica column chromatography using a methylene chloride: methanol gradient mixture.

In this case, the yield was 1.4 g (88%), and the NMR results were as follows: $^1$H NMR (600 MHz, CDDl$_3$): ESI-MS (m/z) for δ C$_{11}$H$_{13}$N$_5$O: 231.25, Calc.: 231.26.

Step 4: Synthesis of 5-(4-Azidobutoxy)-1,3-Dibenzyl-1H-Benzo[d]Imidazol-3-Ium Bromide Benzyl bromide (20 mL, 20 mmol) was added to a suspension of 5-(4-azidobutoxy)-1H-benzo[d]imidazole (1.4 g, 6.05 mmol) and cesium carbonate (Cs$_2$CO$_3$, 1.97 g, 6.05 mmol) in acetonitrile (60 mL). The reaction mixture was stirred at 90° C. for 24 hours in the presence of argon. Thereafter, excessive amounts of the benzyl bromide and the solvent were evaporated under vacuum. The crude product was purified by silica column chromatography using a methylene chloride: methanol gradient mixture.

Step 5: Synthesis of NHC5

5-(4-Azidobutoxy)-1,3-dibenzyl-1H-benzo[d]imidazol-3-ium bromide (80 mg, 0.18 mmol) was dissolved in anhydrous THF (3.6 mL), and stirred in a glove box to obtain a precarbene. As a blank solution, 1 M KHMDS (0.18 mL, 0.18 mmol) in THF was added dropwise to the mixture at room temperature, and stirred for 15 minutes. It was able to be observed that a white precipitate (KI) was immediately formed. The resulting mixture was filtered through a 0.2 μm PTFE syringe filter, and diluted with a carbene with a concentration of 0.05 M to obtain NHC5.

Figure 12:
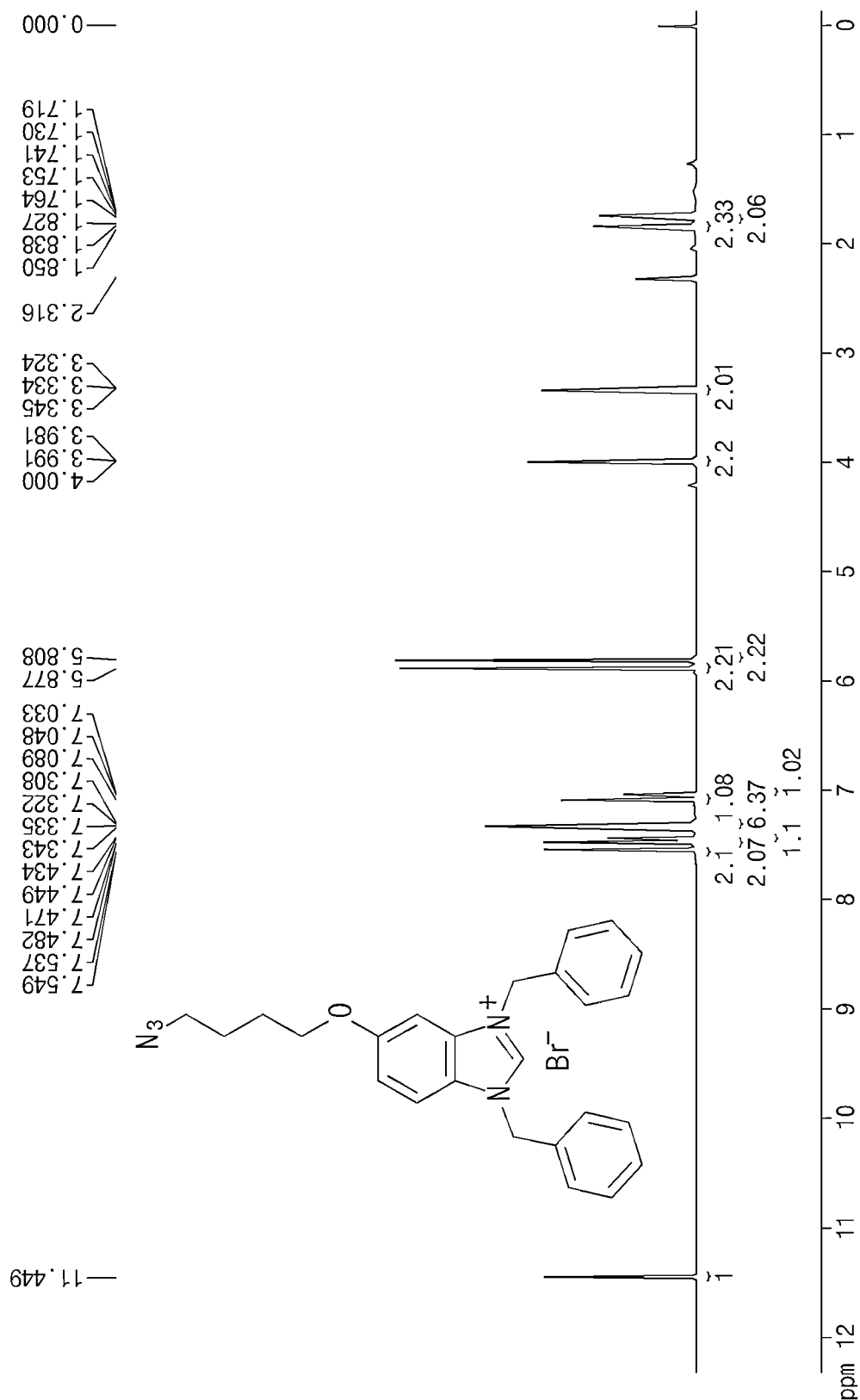
FIG. 12 a graph illustrating the nuclear magnetic resonance spectroscopy (NMR) spectrum of the N-heterocyclic carbene compound (NHC5).

The molecular formula of NHC5 thus fabricated was determined by nuclear magnetic resonance spectroscopy (NMR). The results are shown in FIG. 12.

[EXAMPLES] FABRICATION OF GRAPHENE TRANSISTOR

[Example 1] Fabrication of Graphene Transistor Using NHC1 as Linker Layer

[1-1] Formation of Graphene Channel Layer on Substrate

Figure 15:
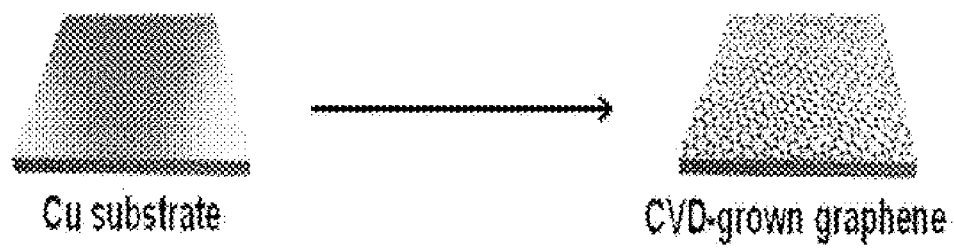
FIG. 15 is a schematic diagram showing that graphene is formed on a copper substrate using a CVD method.
Figure 16:
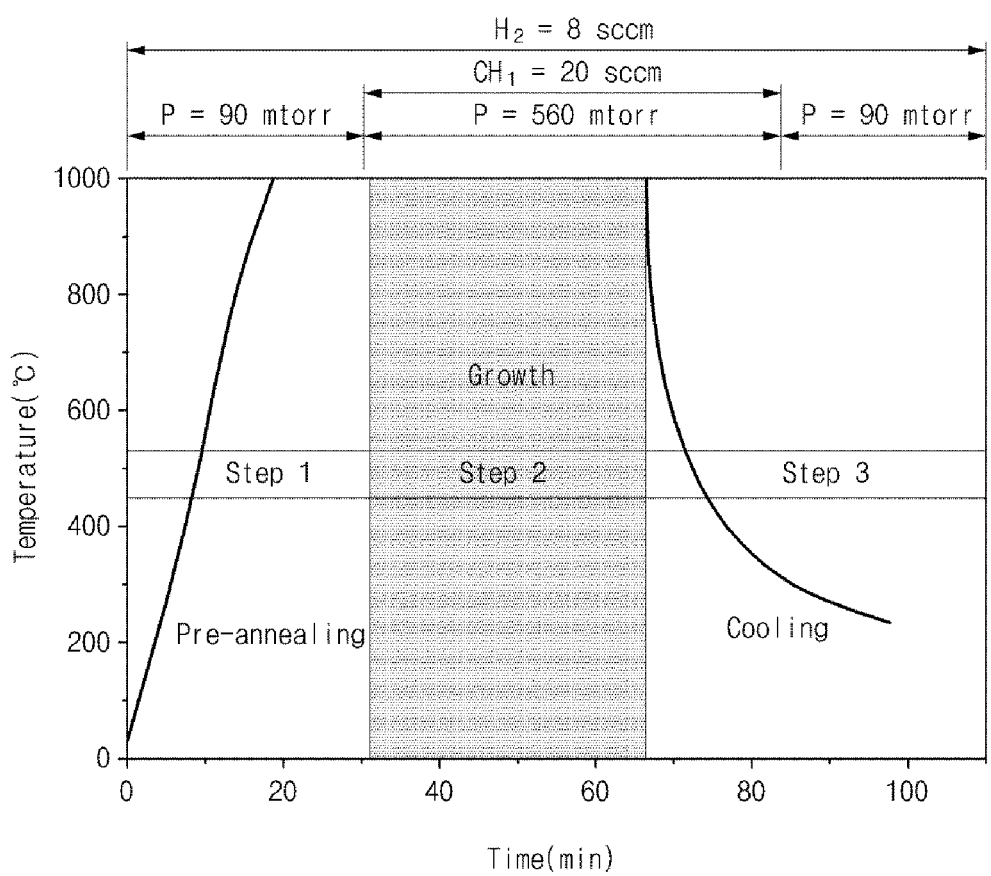
FIG. 16 is a graph illustrating the conditions for a process of forming graphene as shown in FIGS. 6A and 6B.
Figure 17:
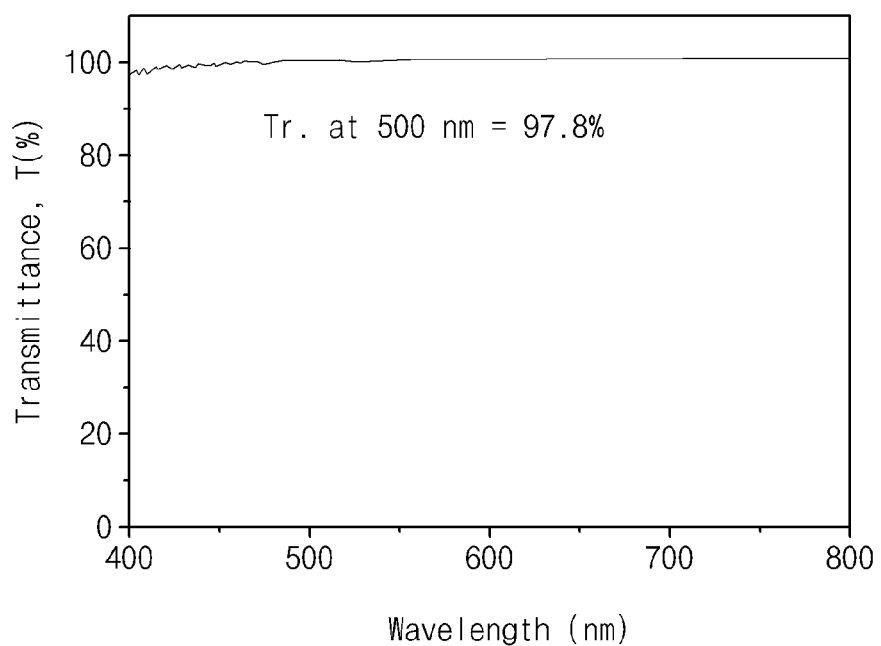
FIG. 17 is a graph illustrating transmittance according to the formation of graphene as shown in FIGS. 6A and 6B.
Figure 18:
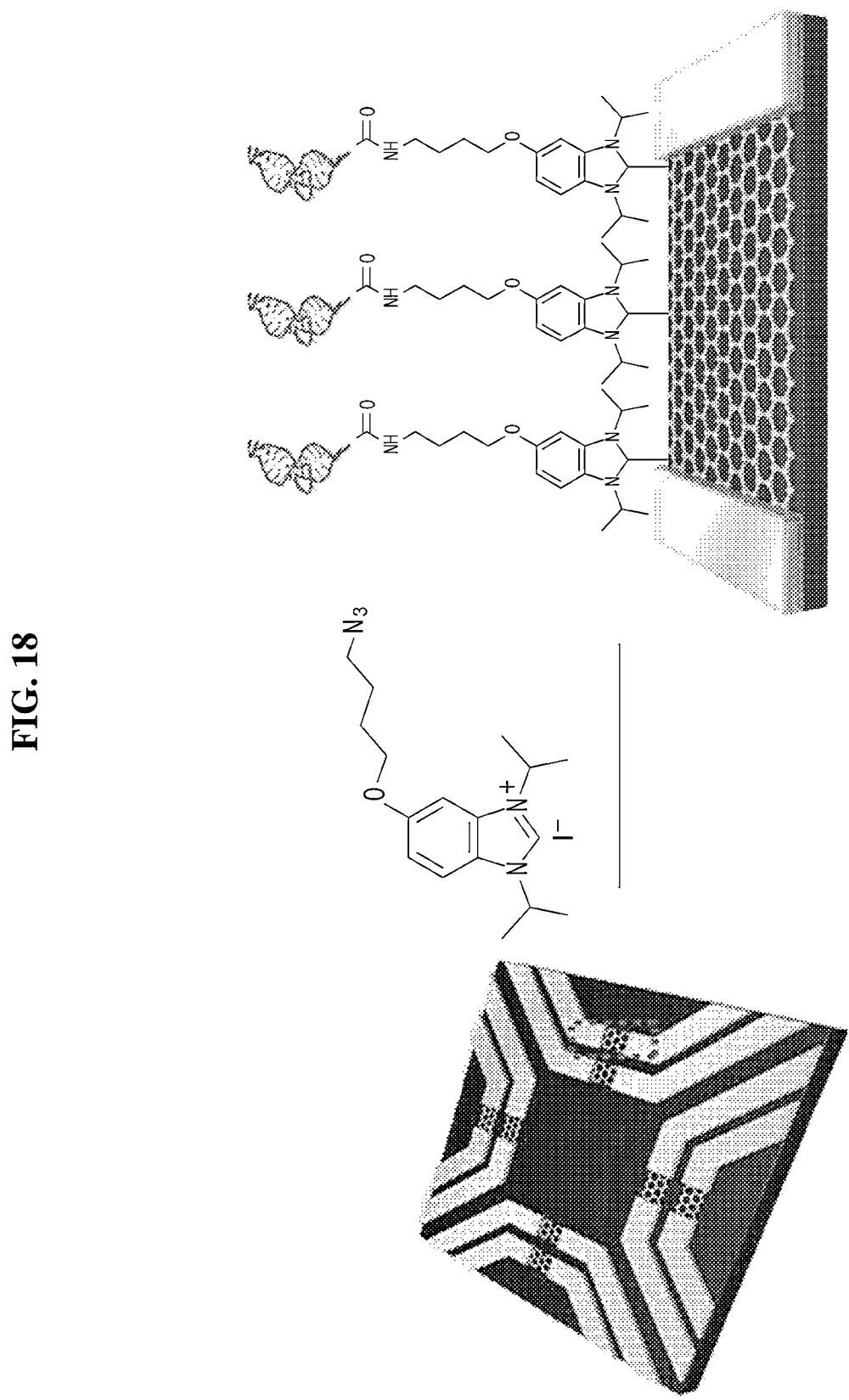
FIG. 18 shows a process of treating a surface of a graphene transistor with the N-heterocyclic carbene compound.

As shown in FIGS. 15 to 17, copper foil was placed in a chamber, and heated to 1,000° C. Then, the heated copper foil was maintained for 30 minutes (pre-annealed for 20 minutes and stabilized for 10 minutes) at a pressure of 90 mTorr and a flow rate of 8 sccm under a H$_2$ atmosphere, and CH$_4$ was added at a total pressure of 560 mTorr at a flow rate of 20 sccm for 40 minutes. Thereafter, the copper foil was cooled to 200° C. at a rate of 35° C./min, and a furnace was cooled to room temperature to form a single graphene layer on the copper foil.

Next, the graphene layer formed on the copper foil was spin-coated with a solution of polymethyl methacrylate (PMMA, MicroChem Corp, 950 PMMA A4, 4% in anisole) at a rate of 6,000 rpm/min, and the graphene layer coated with the PMMA was separated from the copper foil using an etchant. The graphene layer separated from the copper foil as described above was immersed in deionized water for 10 minutes to remove the residual etchant ions remaining in the graphene layer.

The graphene layer thus washed was transferred to a polyethylene naphthalate (PEN) film as a substrate, and a PMMA solution was dropped on the graphene layer to remove PMMA with which the graphene layer had been coated. As a result, a graphene channel layer was formed on the substrate. In this case, the transmittance of the graphene channel layer was maintained at 97.8%.

[1-2] Formation of Micropatterned Electrode

The graphene channel layer formed on the substrate in Example [1-1] was spin-coated with a positive photoresist (AZ5214, Clariant Corp.), and then subjected to UV exposure, baking, and development processes to form a pattern on the graphene channel layer.

A patterned electrode (width (W)/length (L)=1, L=channel length of 100 μm) was formed at both ends of the aligned graphene channel layer thus patterned using an oxygen plasma treatment (RIE) method, and then subjected to image reversal, thermal deposition, and lift-off processes to fabricate a graphene transistor having a micropatterned electrode (W/L=5, L=channel length of 100 μm) formed on the graphene channel layer.

[1-3] Binding of NHC1 to graphene channel layer using dipping method.

Anhydrous THF (5 mL) including 0.25 mmol of benzo[d]imidazol-3-ium iodide or bromide was stirred at room temperature in the presence of argon. At the same time, THF (0.25 mmol) including 1 M HMDS as a blank solution was added dropwise to the benzo[d]imidazol-3-ium solution, and then stirred for 15 minutes to prepare a mixed solution. In this case, it was able to be observed that a solid precipitate (KI or KBr) was immediately formed. Thereafter, the mixed solution was filtered through a 0.25 μm PTFE syringe filter, and diluted with the carbene compound of Preparation Example 1 with a concentration of 0.05 mM to prepare a carbene solution including the NHC1. After the filtration was completed, the graphene transistor fabricated in Example [1-2] was immersed in the carbene solution at room temperature for 20 minutes in the presence of argon, washed with THF, deionized water (DI), and IPA, and then dried under vacuum to fabricate the graphene transistor of Example 1 in which the carbene compound of NHC1 was attached to the graphene channel layer.

[Example 2] Fabrication of Graphene Transistor Using NHC2 as Linker Layer

A graphene transistor was fabricated in the same manner as in Example 1, except that the N-heterocyclic carbene compound (NHC2) of Preparation Example 2 was used.

[Example 3] Fabrication of Graphene Transistor Using NHC3 as Linker Layer

A graphene transistor was fabricated in the same manner as in Example 1, except that the N-heterocyclic carbene compound (NHC3) of Preparation Example 3 was used.

[Example 4] Fabrication of Graphene Transistor Using NHC4 as Linker Layer

A graphene transistor was fabricated in the same manner as in Example 1, except that the N-heterocyclic carbene compound (NHC4) of Preparation Example 4 was used, and the NHC4 was bound to the graphene channel layer using a chemical vapor deposition method below.

The binding of the NHC4 to the graphene channel layer using the chemical vapor deposition method is more specifically described as follows. Anhydrous THF (5 mL) including 0.15 to 0.25 mmol of benzo[d]imidazol-3-ium iodide or bromide was stirred at room temperature in the presence of argon. At the same time, THF (0.15 to 0.25 mmol) including 1 M KHMDS (0.15 to 0.25 mmol) as a blank solution was added dropwise to the benzo[d]imidazol-3-ium solution, and then stirred for 15 minutes to prepare a mixed solution. In this case, it was able to be observed that a solid precipitate (KI or KBr) was immediately formed. Thereafter, the mixed solution was filtered through a 0.2 μm PTFE syringe filter, and diluted with the carbene compound of Preparation Example 4 with a concentration of 0.05 M to prepare a carbene solution including the NHC4. After the filtration was completed, the THF solvent was removed from the mixed solution at 50 to 60° C., and the graphene transistor fabricated in Example [1-2] was decompressed with a pressure of 500 mTorr at 120 to 150° C. for 15 minutes to 30 minutes to vapor-deposit the carbene compound of NHC4 on the graphene channel layer. Then, the graphene transistor was washed with THF and IPA, and then dried under vacuum to fabricate the graphene transistor of Example 4 in which the carbene compound of NHC4 was attached to the graphene channel layer.

[Example 5] Fabrication of Graphene Transistor Using NHC5 as Linker Layer

A graphene transistor was fabricated in the same manner as in Example 1, except that the N-heterocyclic carbene compound (NHC5) of Preparation Example 5 was used.

Comparative Example 1

A graphene transistor was fabricated in the same manner as in Example 1, except that the N-heterocyclic carbene compound was not used.

Comparative Example 2

The graphene transistor fabricated in Examples [1-1] and [1-2] was immersed in 30 mL of a methanol solution including 0.0015% by weight of 1,5-diaminonaphthalene (DAN) to react with DAN. Thereafter, the residual reactants were removed using distilled water, and moisture was removed using nitrogen gas so that a naphthalene ring of the DAN formed a π-π interaction with the graphene channel layer. Then, an amine group (—$NH_2$) of the DAN was exposed to the outside to fabricate a graphene transistor (DAN pi-pi interacted GT) in which a surface of the graphene channel layer was modified with the amine group of the DAN.

Experimental Example 1

Figure 19A:
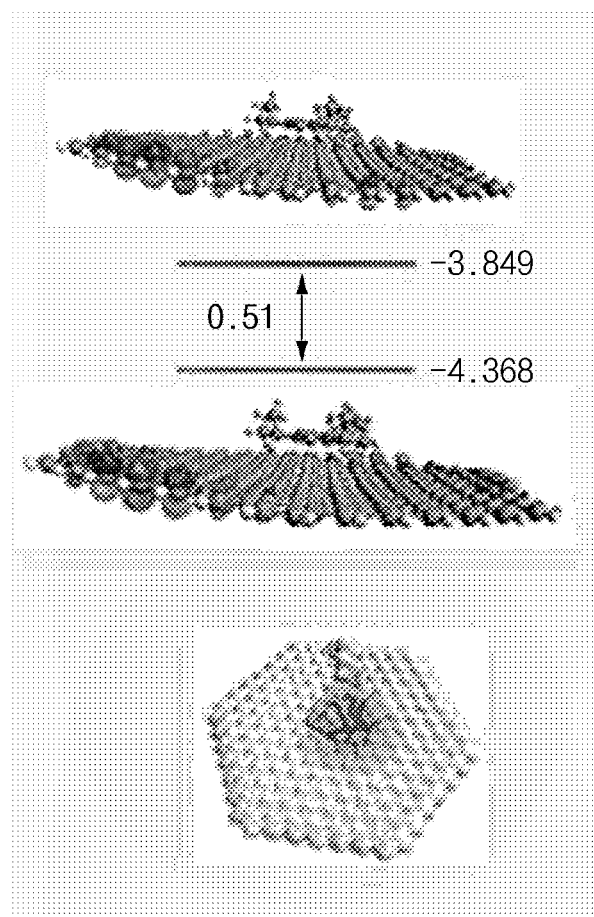
FIGS. 19A to 19C show the density functional theory (DFT) modelings of the graphene transistor.
Figure 19B:
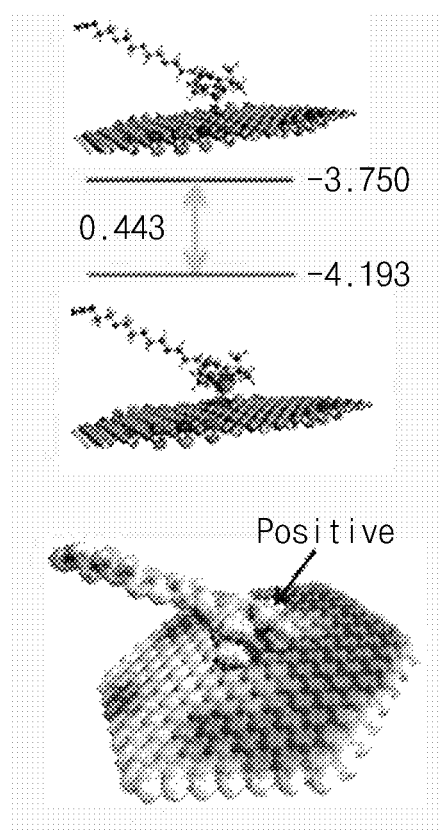
Figure 19C:
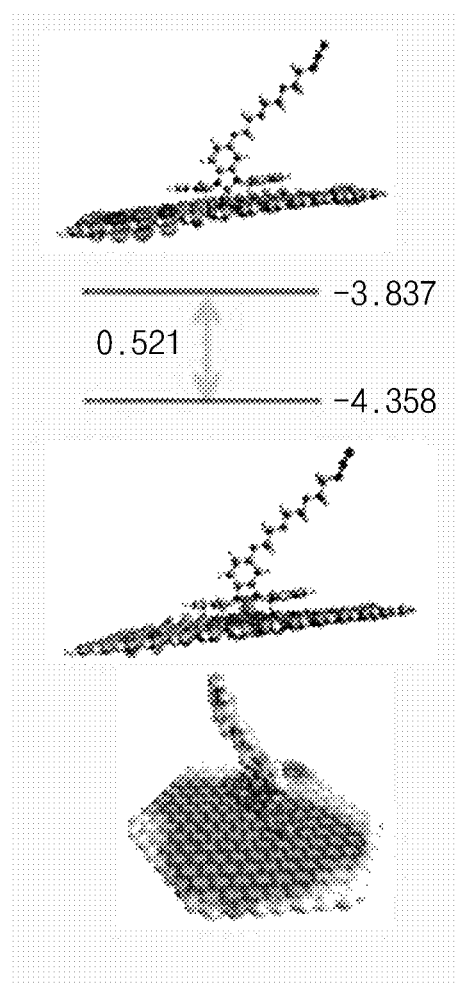
Figure 19D:
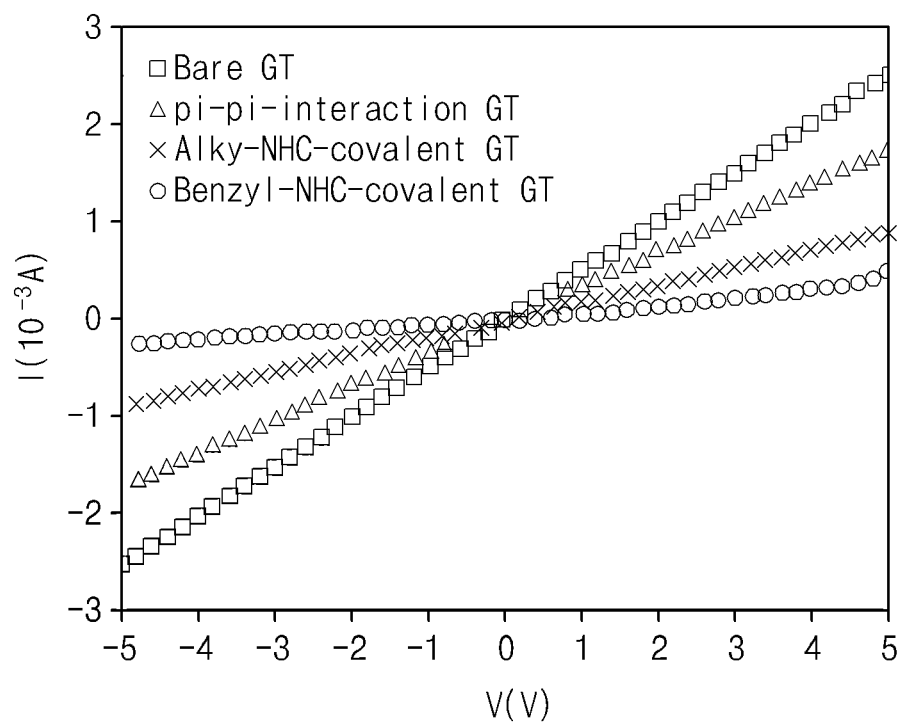
FIG. 19D shows a graph illustrating current-voltage characteristics.
Figure 19E:
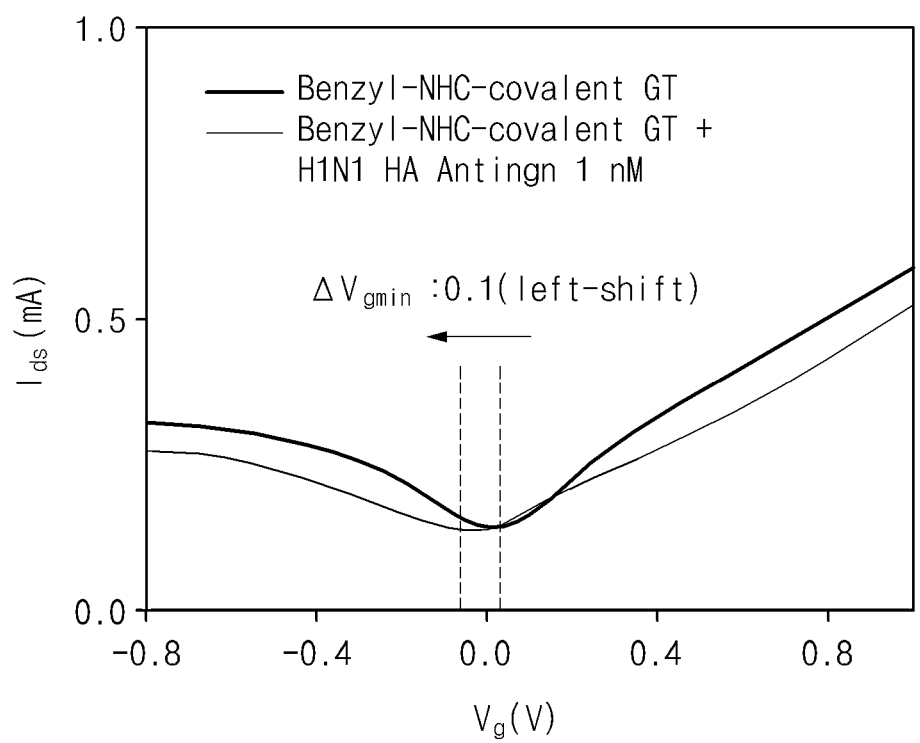
FIG. 19E shows a graph illustrating transition curve characteristics.
Figure 20:
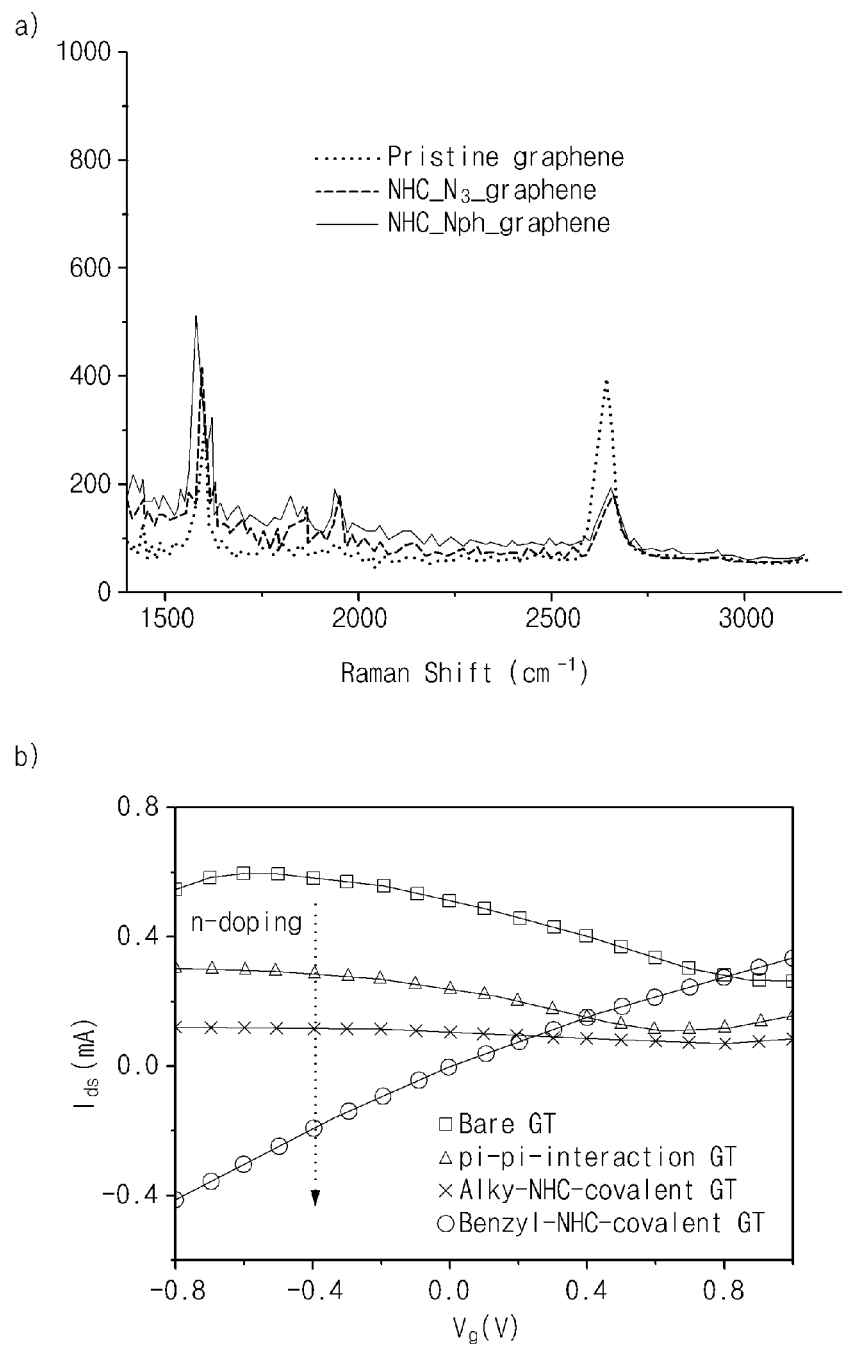
FIG. 20 is a graph illustrating a) the Raman data and b) the current-voltage characteristics of the graphene transistor.
Figure 21:
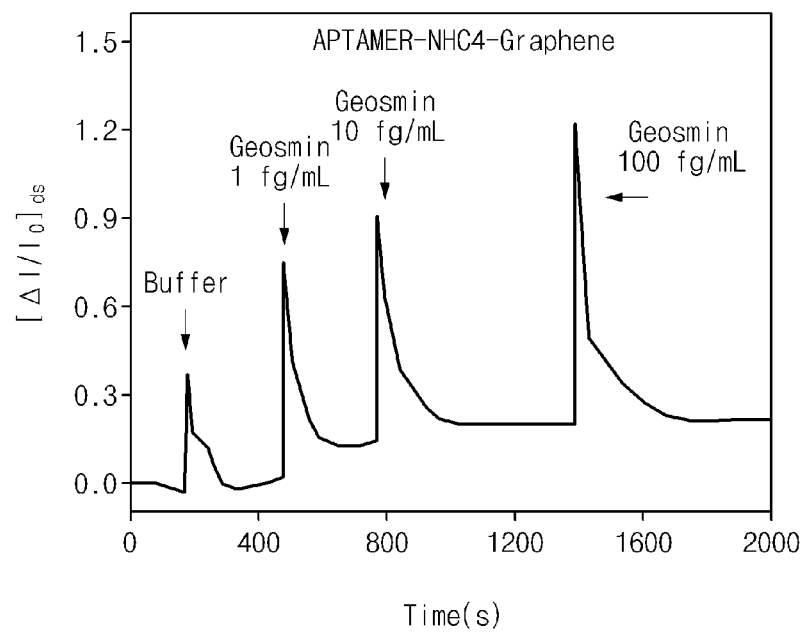
FIG. 21 is a graph illustrating a real-time response of the biosensor including a graphene transistor to geosmin.
Figure 22:
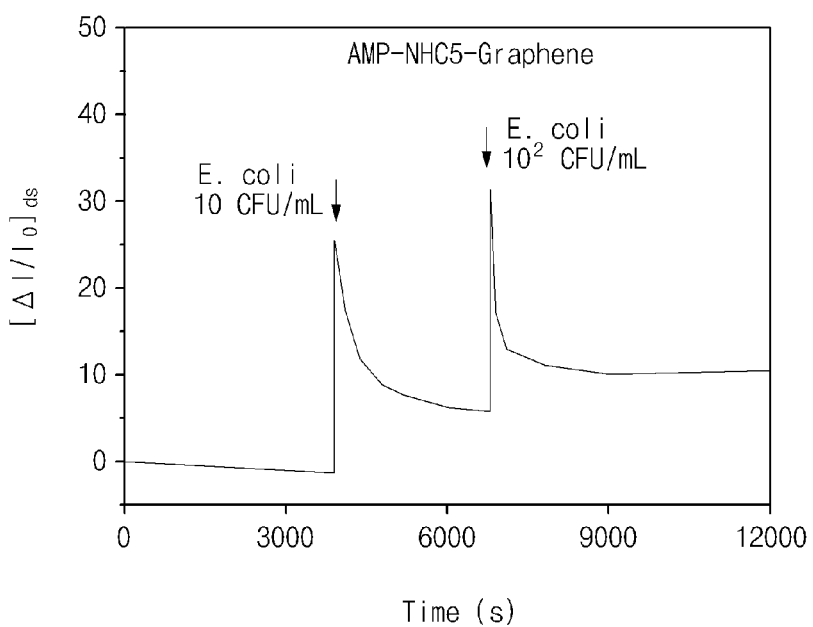
FIG. 22 is a graph illustrating a real-time response of the biosensor including a graphene transistor to *E. coli*.

To determine a difference in binding compatibility of the graphene channel layer to the N-heterocyclic carbene compound, the attachment of the bioprobe unit (an H1N1 HA antibody) to the N-heterocyclic carbene compound, and the doping of the graphene channel layer, the graphene transistors of Example 1 (denoted as 'Alkyl-NHC-covalent GT' in FIG. 19D), Example 2, Example 3 (denoted as 'Benzyl-NHC-covalent GT' in FIG. 19D), Comparative Example 1

(Bare GT), and Comparative Example 2 (DAN pi-pi interacted GT) were prepared. Thereafter, 2 μL of an H1N1 HA antibody with a concentration of 5 ng/mL was added to the graphene channel layer, and then a biosensor in which the H1N1 HA antibody was attached to the linker layer through an EDC-NHS reaction was fabricated. Modeling was performed according to the density functional theory (DFT), and current-voltage characteristics and transition curve characteristics of the biosensor were measured. The results are shown in FIGS. 19A to 19E.

As shown in FIGS. 19A to 19C, it was confirmed that the N-heterocyclic carbene compounds of NHC1 to NHC3 had respective high band gap energies of 0.51 eV, 0.443 eV, and 0.521 eV (corresponding to the strong electron densities) with respect to the graphene channel layer. Therefore, it can be seen that the carbene compound according to the present invention showed excellent binding affinity for the graphene channel layer. As shown in FIG. 19D, it can also be seen that the graphene transistor of Comparative Example 1 (Bare GT) had the lowest electrical resistance. From these facts, it can be seen that the graphene channel layers of Examples 1 and 3 and Comparative Example 1 were able to bond to the carbene compound. Also, it was confirmed that the graphene transistors of Example 1 (Alkyl-NHC-covalent) and Example 3 (Benzyl-NHC-covalent) showed increased electrical resistance, compared to that of Comparative Example 2 (pi-pi interacted GT). Therefore, it can be seen that the H1N1 HA antibody was successfully attached to each of the graphene transistors of Examples 1 and 3.

Meanwhile, as shown in FIG. 19E, it can be seen that the graphene channel layer was n-doped with the N-heterocyclic carbene compound (NHC3) because a transition curve was shifted by approximately 0.1 V to the left when an H1N1 HA antigen was added.

Experimental Example 2

To check a change of the graphene channel layer by the N-heterocyclic carbene compound and by the n-doping of the N-heterocyclic carbene compound, the graphene transistors of Example 1 (Alkyl-NHC-covalent GT), Example 3 (Benzyl-NHC-covalent GT), Comparative Example 1 (Bare GT), and Comparative Example 2 (pi-pi interacted GT) were fabricated, and subjected to Raman spectroscopy. Thereafter, current-voltage characteristics of the graphene transistors were measured. The results are shown in FIG. 20. In this case, pristine graphene refers to graphene in which the graphene channel layer was not functionalized with the N-heterocyclic carbene compound.

As shown in a) of FIG. 20, it can be seen that the graphene transistors functionalized with an azide group (NHC_$N_3$_graphene, Example 1) or a phthalimide group (NHC_Nph_graphene, Example 3) have a large and sharp peak in the vicinity of 1,600 ($cm^{-1}$), indicating that the graphene channel layer was composed of a single layer.

On the contrary, it can be seen that the graphene transistor of Comparative Example 1 using graphene which was not functionalized with the N-heterocyclic carbene compound has the largest peak in the vicinity of 2,600 ($cm^{-1}$), indicating that the graphene channel layer was formed of multiple layers.

As shown in b) of FIG. 20, it was confirmed that the n-doping increased in the order of the graphene transistors of Comparative Example 1, Comparative Example 2, Example 1 and Example 3. Therefore, it can be seen that the drain current (Ids) negatively increased at a constant gate voltage ($V_g$), indicating that the attachment amount of N-heterocyclic carbene compound also increased.

Experimental Example 3

To check the sensitivity of the biosensor, the graphene transistor of Example 3 (Benzyl-NHC-covalent GT) in which the carbene compound was formed was fabricated. Thereafter, 2 μL of an H1N1 HA antibody and 2 μL of a dopamine antibody (with a concentration of 5 ng/mL) were each added to the graphene channel layer, and then a biosensor in which each of the H1N1 HA antibody and the dopamine antibody was attached to the linker layer through an EDC-NHS reaction was fabricated. Then, a detection test was performed by treating the biosensor with the H1N1 HA antigen (with a concentration of 0.1 nM to 100 nM) or 100 nM dopamine against each of the antibodies using a PBS solution. The results are shown in FIGS. 13 and 14.

As shown in FIGS. 13 and 14, it was confirmed that the H1N1 HA antigen and the dopamine were able to be detected to a concentration of 1 nM and a concentration of 100 nM, respectively, using the biosensor according to the present invention.

Also, the graphene transistor of Example 4 in which the carbene compound was formed was fabricated. Thereafter, 2 μL of a geosmin-specific aptamer (5'-CTCTCGGGACGACCCGTTTGTTCCTCGGCTTTT-TAAGAGGTCTGGTTGATGTCGTC CC-3', Bioneer Corp.) was added to the graphene channel layer, and then a biosensor in which the geosmin-specific aptamer was attached through an EDC-NHS reaction was fabricated. Then, a detection test was performed by treating the biosensor with 1 to 100 fg/mL of geosmin using a PBS solution. As a result, it was confirmed that the geosmin was able to be detected to a concentration of 1 fg/mL using the biosensor according to the present invention, as shown in FIG. 21.

Further, the graphene transistor of Example 5 in which the carbene compound was formed was fabricated. Thereafter, 2 μL of AMP (Magainin 1, Lugen Sci Inc.) (with a concentration of 5 ng/mL) was added to the graphene channel layer, and then a biosensor in which the AMP was attached through an EDC-NHS reaction was fabricated. Then, a detection test was performed by treating the biosensor with 10 to 100 CFU/mL of *E. coli* using a PBS solution. As a result, it was confirmed that the *E. coli* was able to be detected to 10 CFU/mL using the biosensor according to the present invention, as shown in FIG. 22.

The invention claimed is:

1. A graphene transistor comprising:

a substrate;

a graphene channel layer arranged on the substrate;

a pair of metals arranged on both ends of the graphene channel layer to be spaced from each other; and a linker layer arranged on the graphene channel layer and made of an N-heterocyclic carbene compound, wherein the N-heterocyclic carbene compound has a chemical structure represented by the following Formula 1:

[Formula 1]

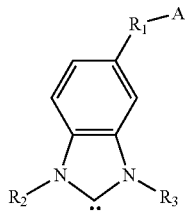

wherein A is an azide group or a phthalimide group, $R_1$ is an alkylene group or an alkoxyalkylene group, having 1 to 10 carbon atoms and comprising 1 to 5 repeating units, and $R_2$ and $R_3$ is each independently any one selected from a group consisting of an alkyl group, a cycloalkyl group, an alkenyl group, an alkynyl group, an aryl group, an alkylene group, an alkenylene group, an alkynylene group, an alkoxy group, and an arylalkyl group, and wherein a carbene group of the N-heterocyclic carbene compound of the linker layer forms a covalent bond with a graphene of the graphene channel layer.

2. The graphene transistor of claim 1, wherein the N-heterocyclic carbene compound comprises at least one selected from the group consisting of 6-4(-azidobutoxy)-1,3-diisopropyl-1H-benzo [d]imidazol-2-ylidene, 6-(2-(2-(2-(2-azidoethoxy)ethoxy)ethoxy)ethoxy)-1,3-diisopropyl-1H-benzo[d]imidazol-2-ylidene, 6-(2-(2-(2-(2-azidoethoxy)ethoxy)ethoxy)ethoxy)-1,3-dibenzyl-1H-benzo[d]imidazol-2-ylidene, 6-(4-(1,3-diisoindolin-2-yl)butoxy)-1,3-diisopropyl-1H-benzo[d]imidazol-2-ylidene, and 6-(4-azidobutoxy-1,3-dibenzyl-1H-benzo[d]imidazol-2-ylidene.

3. The graphene transistor of claim 1, wherein the N-heterocyclic carbene compound is formed on the graphene channel layer exposed between the pair of metals.

4. The graphene transistor of claim 1, wherein the N-heterocyclic carbene compound forms a self-bonding monolayer.

5. The graphene transistor of claim 1, wherein the linker layer has a thickness of 0.1 nm to 1 nm.

6. The graphene transistor of claim 1, wherein the graphene channel layer comprises monolayer or bilayer graphene.

7. A fabrication method for a graphene transistor, comprising:

growing graphene on a substrate using a hydrocarbon gas as carbon source by means of a chemical vapor deposition method to form a graphene channel layer;

forming a pair of metals on the graphene channel layer by means of a thermal deposition process; and forming a linker layer on a surface of the graphene channel layer, which is exposed to the outside, by using a surface treatment agent comprising an N-heterocyclic carbene compound;

wherein the N-heterocyclic carbene compound has a chemical structure represented by the following Formula 1:

[Formula 1]

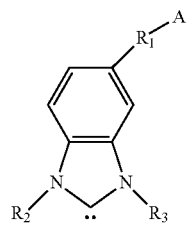

wherein A is an azide group or a phthalimide group, $R_1$ is an alkylene group or an alkoxyalkylene group, having 1 to 10 carbon atoms and comprising 1 to 5 repeating units, and $R_2$ and $R_3$ is each independently any one selected from a group consisting of an alkyl group, a cycloalkyl group, an alkenyl group, an alkynyl group, an aryl group, an alkylene group, an alkenylene group, an alkynylene group, an alkoxy group, and an arylalkyl group, wherein a carbene group of the N-heterocyclic carbene compound of the linker layer forms a covalent bond with a graphene of the graphene channel layer.

8. The fabrication method of claim 7, wherein the N-heterocyclic carbene compound is synthesized using an imidazolium salt as a source.

9. A biosensor comprising the graphene transistor of claim 1.

10. The biosensor of claim 9, wherein the biosensor comprises a bioprobe unit bound to an azide group or a phthalimide group exposed at a linker layer of the graphene transistor, and the bioprobe unit comprises a probe material comprising at least one selected from the group consisting of DNA, RNA, an antigen, an antibody, and a peptide.

11. The biosensor of claim 10, wherein the antigen and the antibody are an H1N1 HA antigen and an H1N1 HA antibody, respectively.

\* \* \* \* \*